US008314400B2

(12) United States Patent
Nikolic et al.

(10) Patent No.: US 8,314,400 B2
(45) Date of Patent: Nov. 20, 2012

(54) METHOD TO PLANARIZE THREE-DIMENSIONAL STRUCTURES TO ENABLE CONFORMAL ELECTRODES

(75) Inventors: Rebecca J. Nikolic, Oakland, CA (US); Adam M. Conway, Livermore, CA (US); Robert T. Graff, Modesto, CA (US); Catherine Reinhardt, Livermore, CA (US); Lars F. Voss, Pleasanton, CA (US); Qinghui Shao, Riverside, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 38 days.

(21) Appl. No.: 13/014,879

(22) Filed: Jan. 27, 2011

(65) Prior Publication Data

US 2012/0043632 A1    Feb. 23, 2012

Related U.S. Application Data

(63) Continuation-in-part of application No. 11/414,288, filed on Apr. 27, 2006, now abandoned.

(60) Provisional application No. 60/675,654, filed on Apr. 27, 2005.

(51) Int. Cl.
    *G01T 3/00* (2006.01)
(52) U.S. Cl. .................................. 250/390.01
(58) Field of Classification Search . 250/390.01–390.12
    See application file for complete search history.

(56) References Cited

U.S. PATENT DOCUMENTS

| | | | |
|---|---|---|---|
| 4,941,942 A * | 7/1990 | Bruns et al. | 216/2 |
| 6,727,504 B1 * | 4/2004 | Doty | 250/390.01 |
| 6,867,444 B1 * | 3/2005 | Hughes | 257/252 |
| 2003/0214699 A1 * | 11/2003 | Banin et al. | 359/333 |
| 2004/0241991 A1 * | 12/2004 | Aoyama et al. | 438/689 |
| 2005/0258372 A1 * | 11/2005 | McGregor et al. | 250/390.01 |

OTHER PUBLICATIONS

Shultis et al., "Efficiencies of coated and perforate semiconductor neutron detectors," 2004, IEEE Nuclear Science Symposium Conference Record, vol. 7, pp. 4569-4574.*
Nikolic, et al. "6:1 Aspect Ratio Silicon Pillar Based Thermal Neutron Detector Filled with 10B.", American Institute of Physics, Applied Physics Letter, pp. 93-95, Sep. 29, 2008.

* cited by examiner

*Primary Examiner* — Kiho Kim
(74) *Attorney, Agent, or Firm* — John P. Wooldridge

(57) ABSTRACT

Methods for fabricating three-dimensional PIN structures having conformal electrodes are provided, as well as the structures themselves. The structures include a first layer and an array of pillars with cavity regions between the pillars. A first end of each pillar is in contact with the first layer. A segment is formed on the second end of each pillar. The cavity regions are filled with a fill material, which may be a functional material such as a neutron sensitive material. The fill material covers each segment. A portion of the fill material is etched back to produce an exposed portion of the segment. A first electrode is deposited onto the fill material and each exposed segment, thereby forming a conductive layer that provides a common contact to each the exposed segment. A second electrode is deposited onto the first layer.

40 Claims, 18 Drawing Sheets

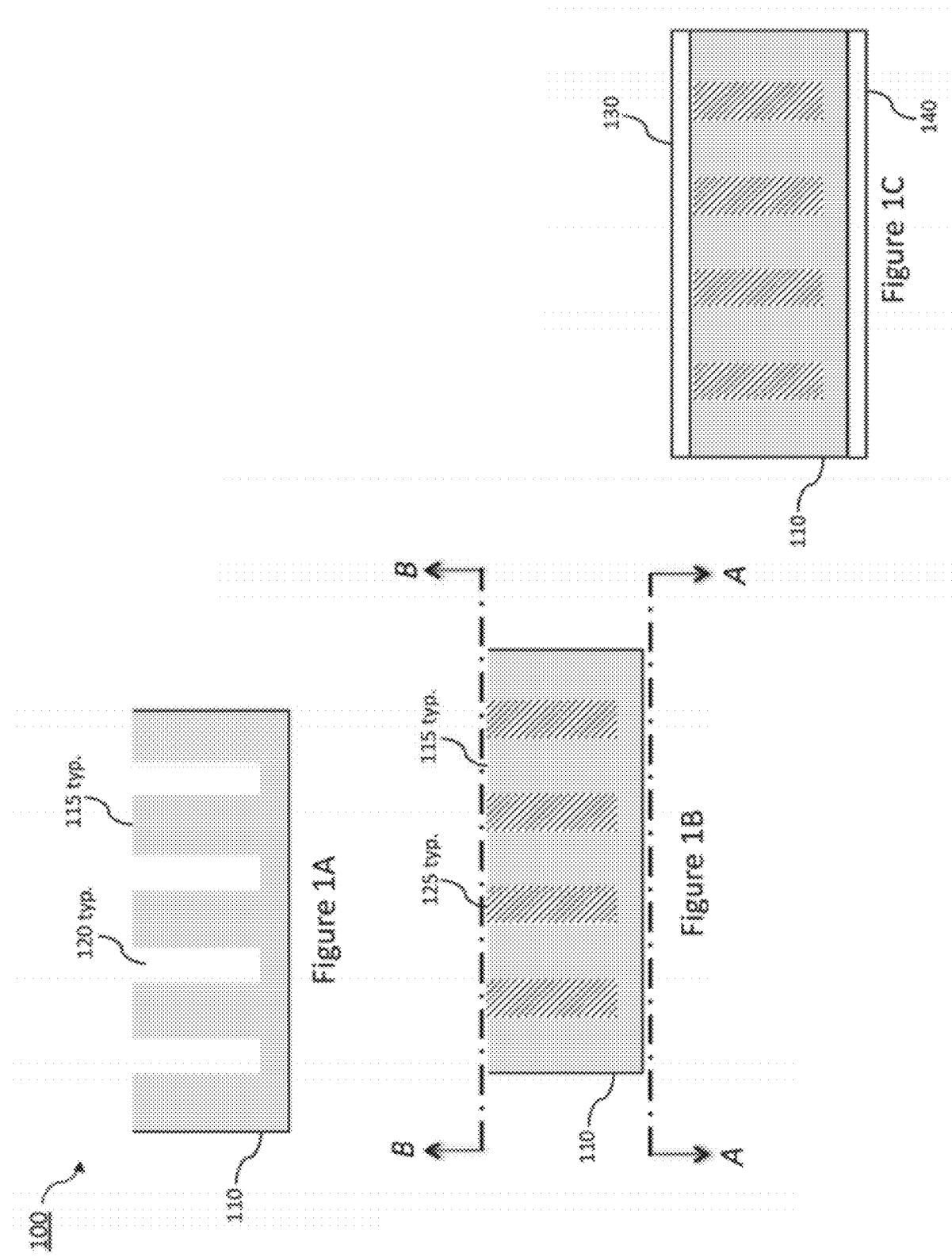

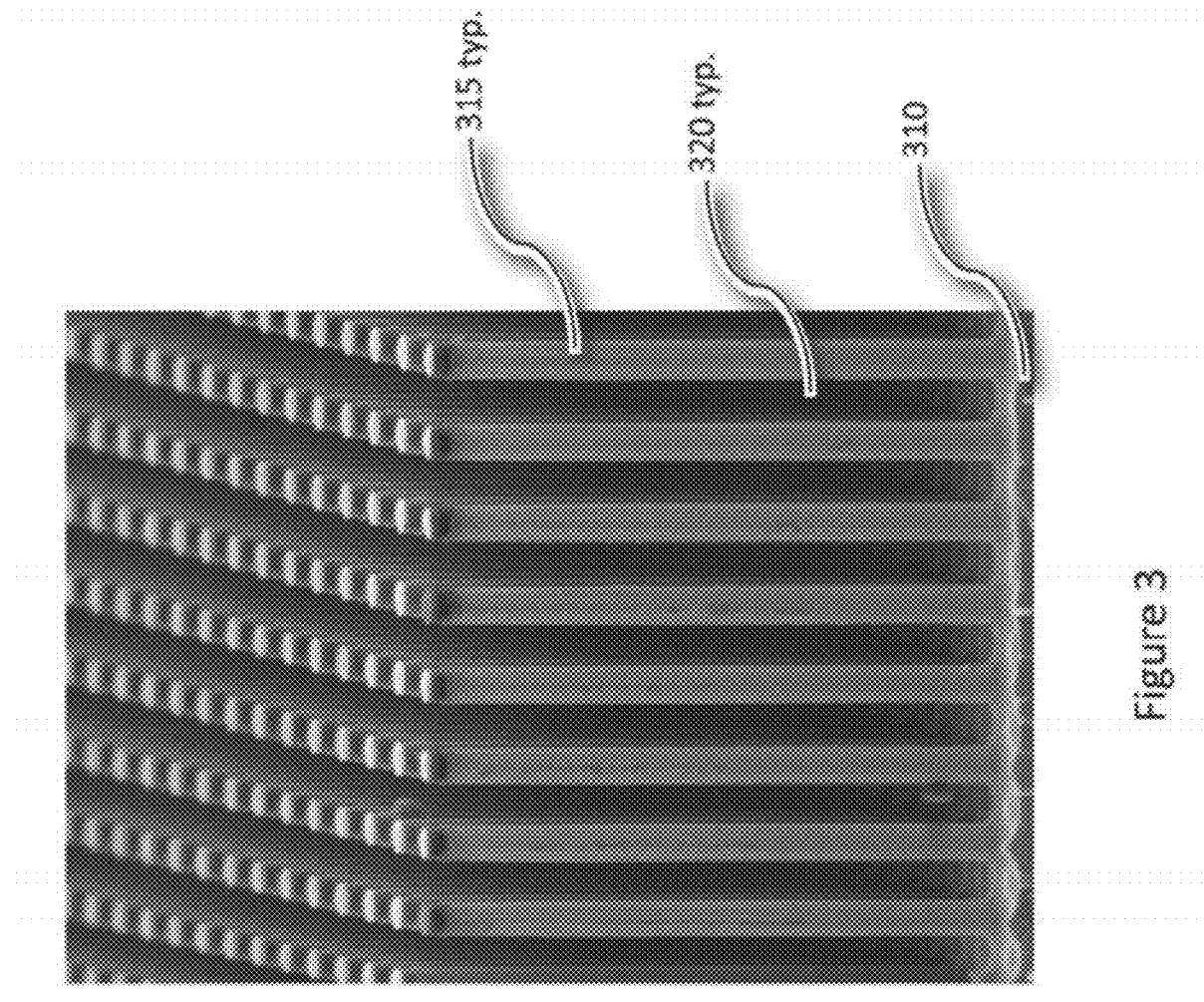
Figure 3

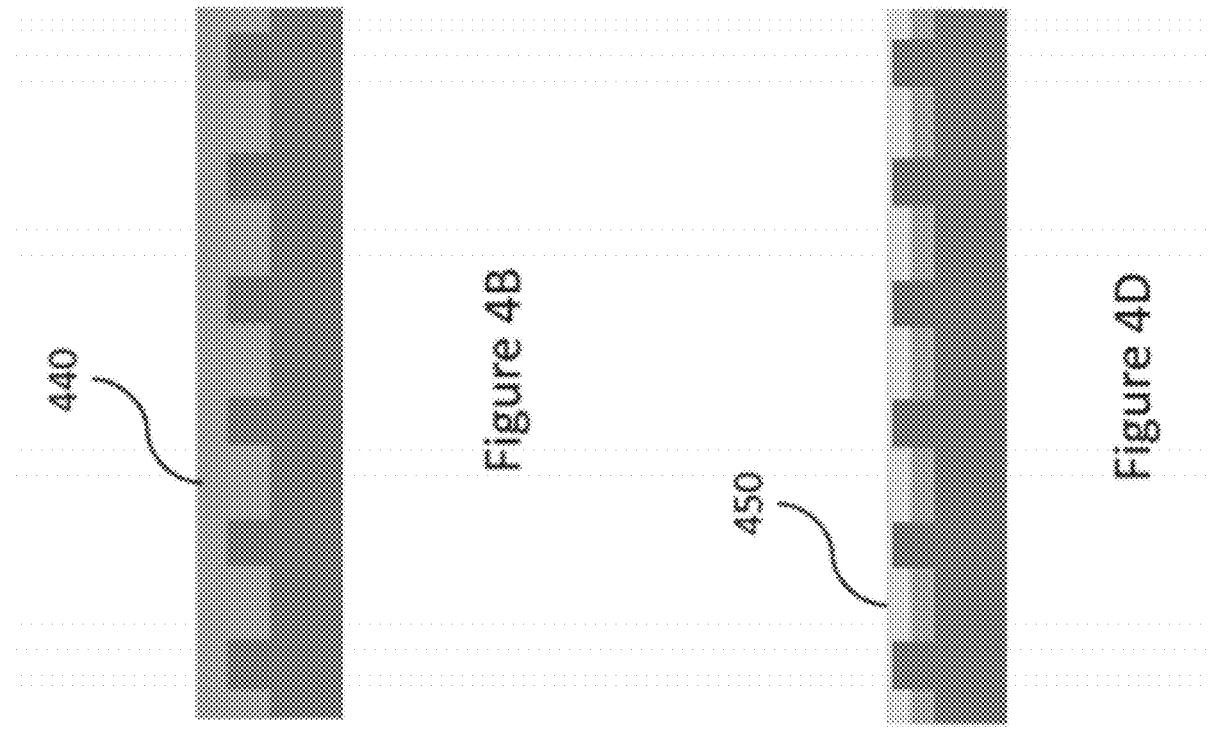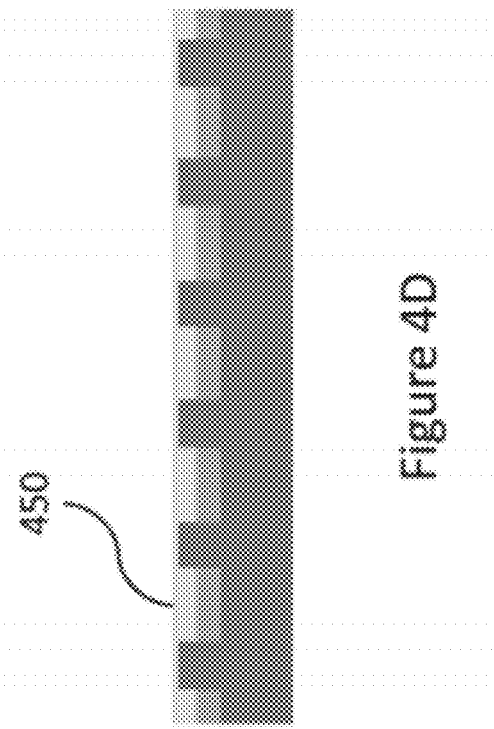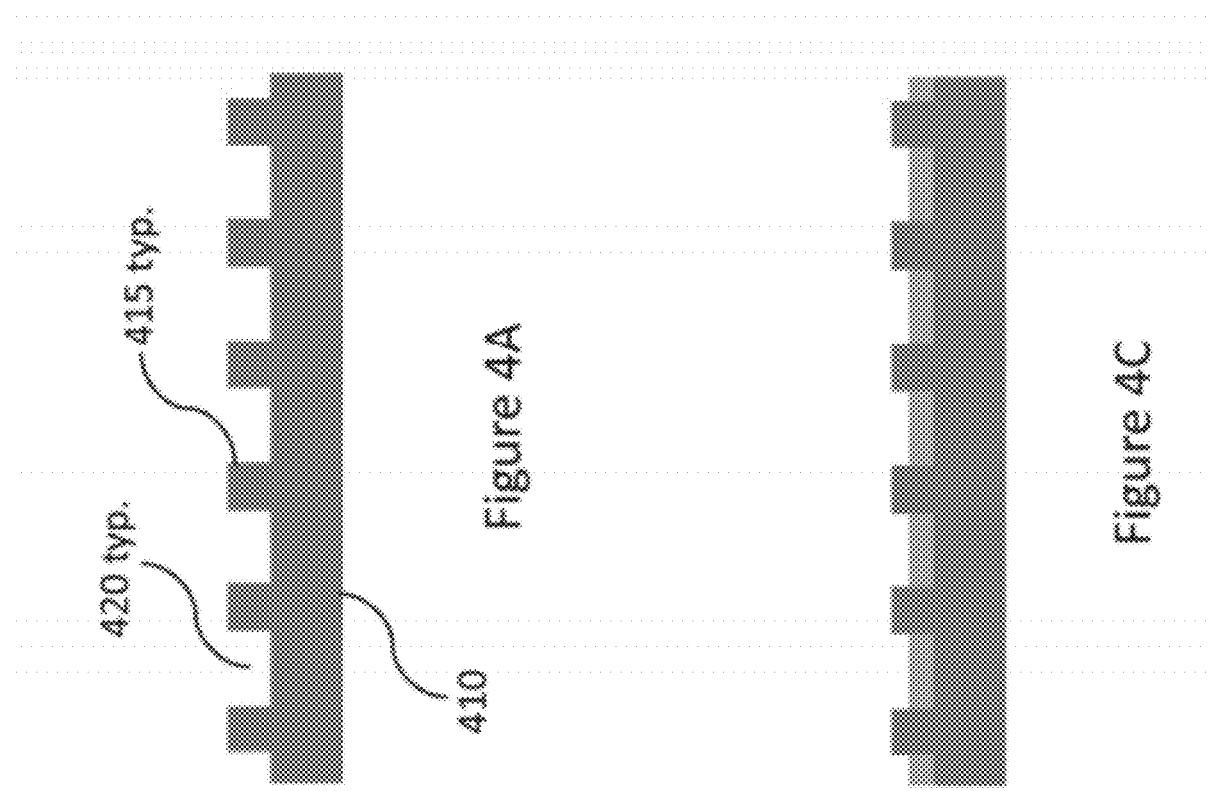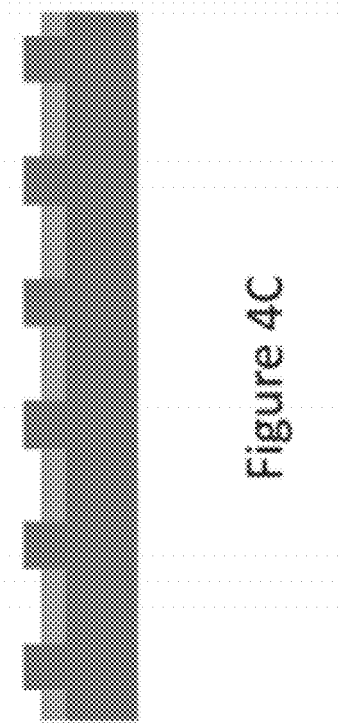

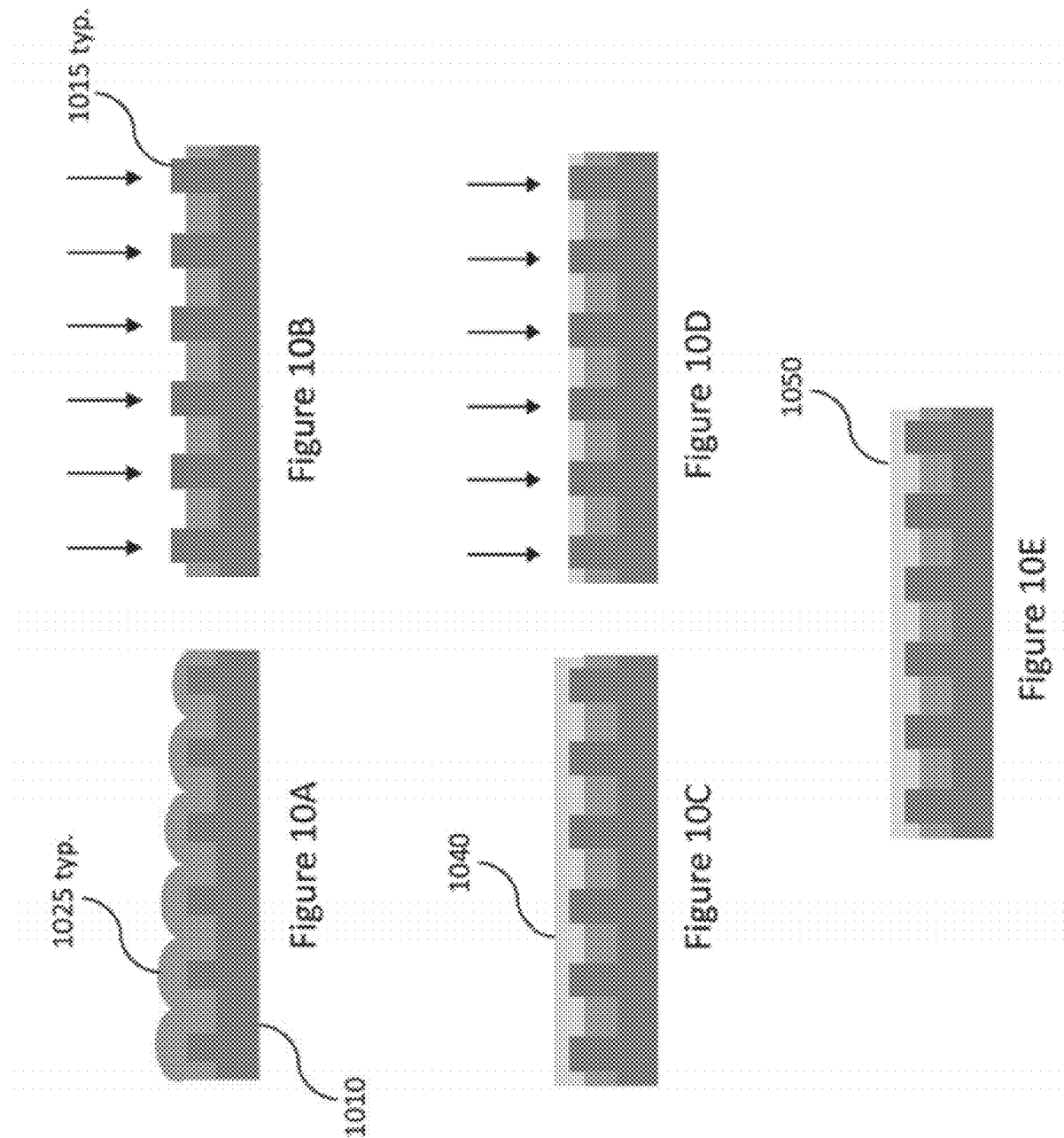

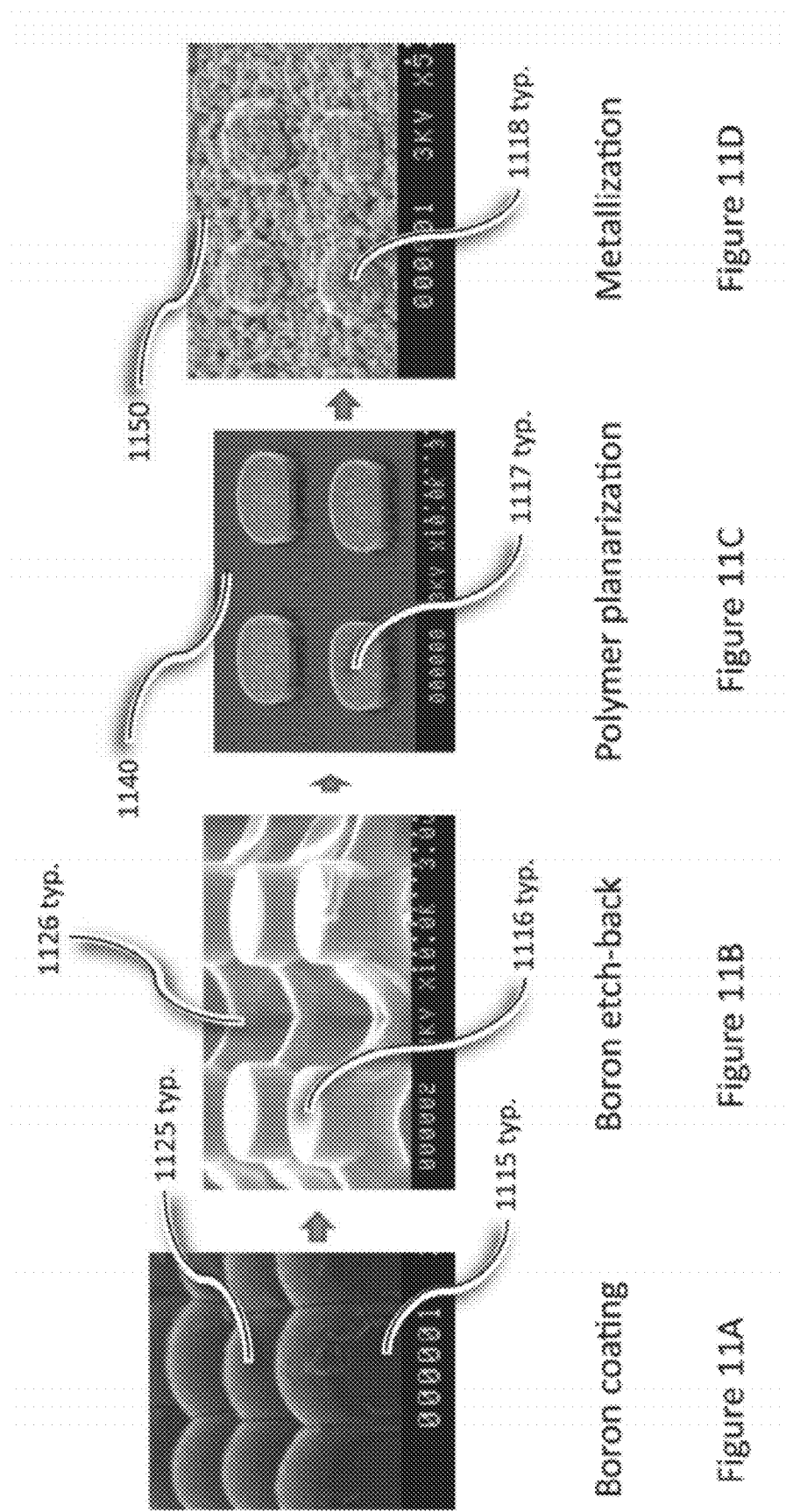

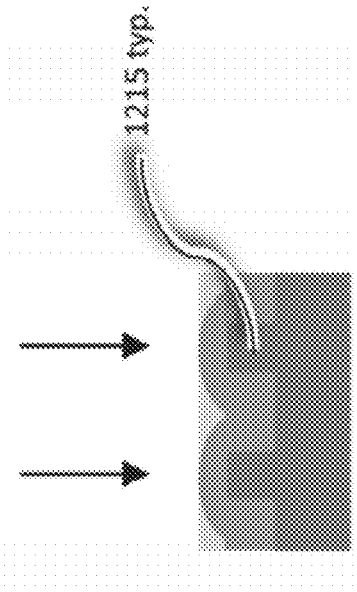
Figure 12B
Figure 12C
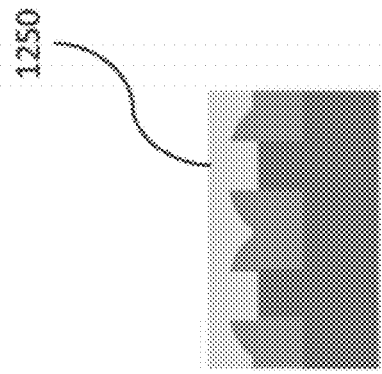
Figure 12F
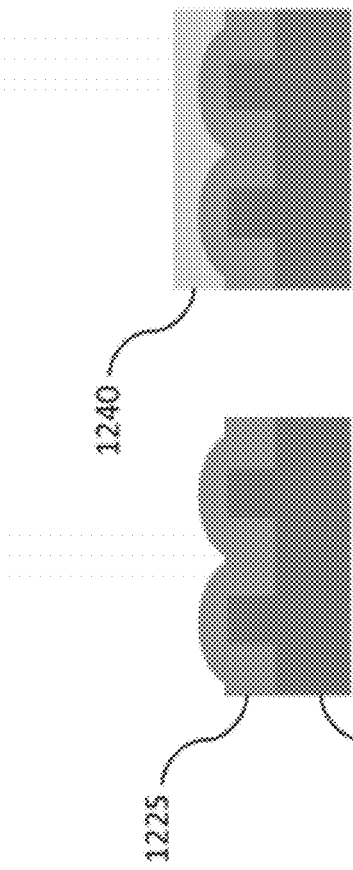
Figure 12A
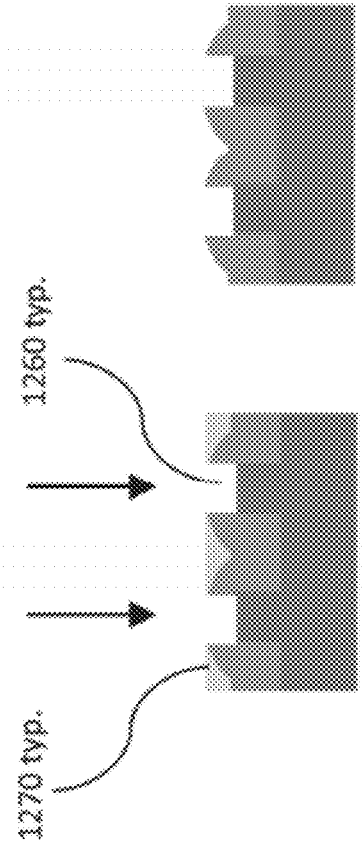
Figure 12D
Figure 12E

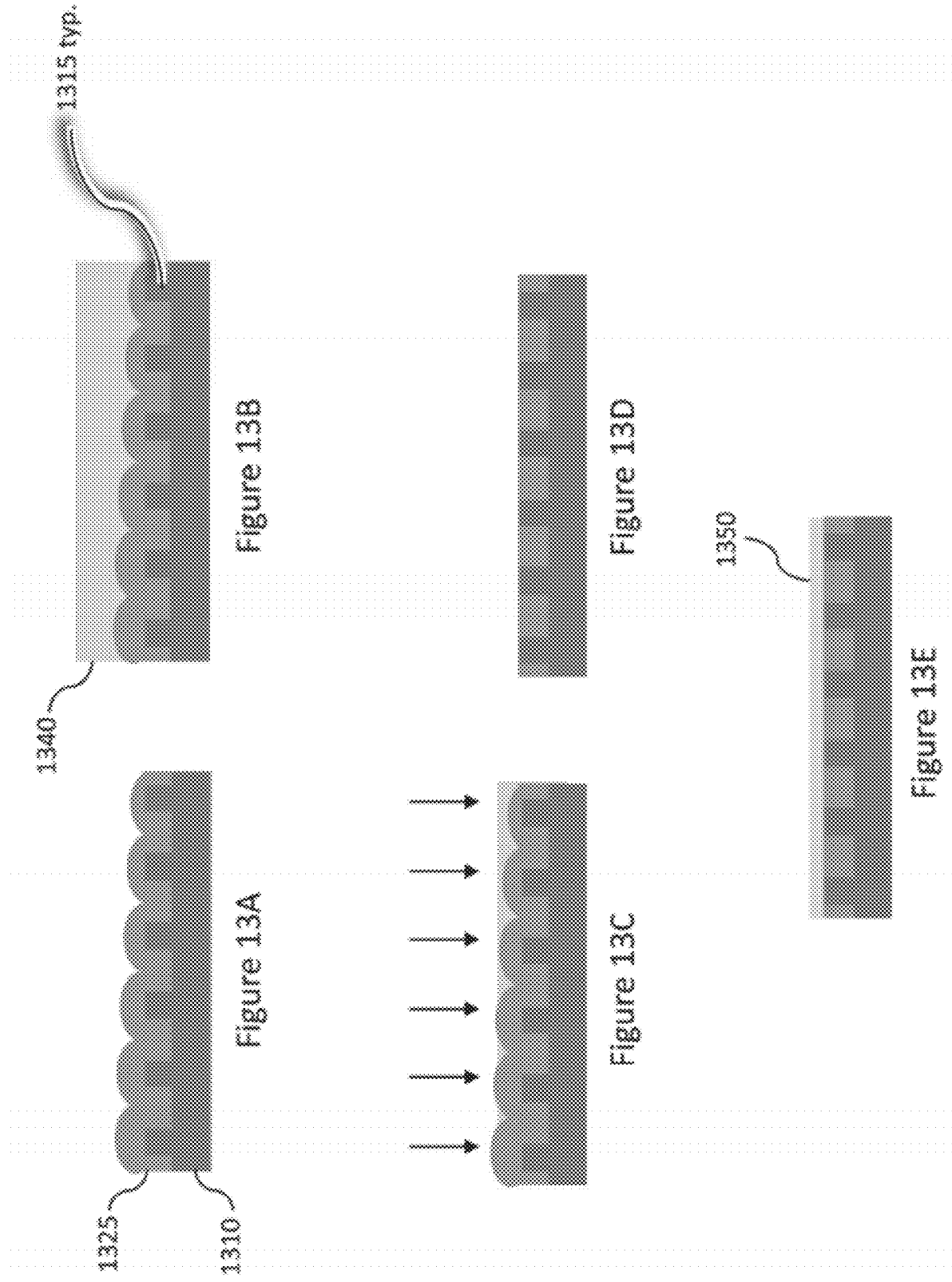

METHOD TO PLANARIZE THREE-DIMENSIONAL STRUCTURES TO ENABLE CONFORMAL ELECTRODES

CROSS-REFERENCE TO RELATED APPLICATIONS

This is a continuation-in-part of U.S. patent application Ser. No. 11/414,288, titled "Semiconductor Materials Matrix for Neutron Detection," filed Apr. 27, 2006 now abandoned, incorporated herein by reference. U.S. patent application Ser. No. 11/414,288 claims priority to U.S. provisional application Ser. No. 60/675,654, titled "Semiconductor Nano-Materials Matrix for Neutron Detection," filed Apr. 27, 2005, incorporated herein by reference.

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

1. Field of the Invention

The present invention relates to the detection of neutrons, more particularly, the present invention relates to structures configured for the detection of neutrons where such structures use high cross-section converter materials in three dimensional high-efficiency configurations.

2. Description of Related Art

Present technology for radiation detection suffers from flexibility and scalability issues. Since neutrons have no charges and do not interact significantly with most materials, special neutron converters such as, pure Boron 10 in solid form are needed to react with neutrons to produce charged particles that can be easily detected by semiconductor devices to generate electrical signals.

A commonly used geometry involves the use of a planar semiconductor detector over which a neutron reactive film has been deposited. Upon a surface of the semiconductor detector is attached a coating that releases ionizing radiation reaction products upon the interaction with a neutron. The ionizing radiation reaction products can then enter into the semiconductor material of the detector thereby creating a charge cloud of electrons and "holes," which can be sensed to indicate the occurrence of a neutron interaction within the neutron sensitive film. The charges are swept through such configured detectors via methods known by those of ordinary skill in the art and registered as an electrical signal.

Another geometry includes etched trenches, slots, or holes in semiconductor materials having dimensions on the micron scale or larger that are filled with predetermined converter materials and configured with electrodes so as to produce detectors similar to the planar detector geometries discussed above.

A need exists for new and/or improved high-efficiency radiation detectors based on materials having three dimensional hierarchical structures at the micro and at the nano dimensional scale level. The present invention is directed to such a need.

SUMMARY OF THE INVENTION

An embodiment of the invention provides a method for fabricating a three-dimentional structure having conformal electrodes. The structure includes a first layer and an array of pillars with cavity regions between the pillars, where each pillar of the pillars includes a first end and a second end, where the first end is in contact with the first layer, where the first layer includes only one of n material (e.g., n+ material) or p material, where each the pillar includes an intrinsic material. A segment is formed on the second end of each pillar, where the segment includes the p material if the first layer includes the n material and where the segment includes the n material if the first layer includes the p material. Cavity regions are filled with a fill material, where the fill material covers each segment. A portion of the fill material is etched back to produce an exposed portion of the segment. A first electrode is deposited onto the fill material and each exposed segment, thereby forming a conductive layer that provides a common contact to each exposed segment. A second electrode is deposited onto the first layer.

The fill material may be a support material for supporting the pillars. The support material may be spin coated into the cavity regions. The support material can be selected from a photoresist, a polymer and a dielectric. In some embodiments, the fill material is a functional material, which may be, e.g., a neutron sensitive material which may be, e.g., selected from lithium fluoride, gadolinium and boron. In some cases, the 3-D structure is formed of Si. The neutron sensitive material includes a length sufficient to absorb neutrons propagating along the long aspect of any the cavity region, and may be sufficiently long to absorb all such neutrons. The pillar may have an aspect ratio within a range from greater than 5 to less than 500. The pillars are separated by less than the range of a mean free path of a charged particle produced within the functional material. Each cavity region has a diameter that is less than the range of at least one neutron reaction-produced particle produced within the functional material.

In some embodiments, between the step of etching back a portion of the fill material and simultaneously depositing an electrode, the method further includes depositing a sacrificial layer over the fill material and the exposed portion, and further includes etching back the sacrificial layer to expose at least part of the exposed portion. In some embodiments, the step of etching back a portion of the fill material to produce an exposed portion of the segment includes (i) depositing a sacrificial layer over the fill material, (ii) etching back the sacrificial layer to about the fill material, (iii) etching back a portion of the fill material to produce an exposed portion of the segment, and (iv) removing any remaining sacrificial material in contact with the fill material. In some cases the etch rate of the sacrificial layer may be greater than, equal to or less than the etch rate of the fill material. In some embodiments, the step of etching back a portion of the fill material to produce an exposed portion of the segment includes the step of etching back a portion of the fill material to produce an exposed portion of the segment includes depositing a sacrificial layer over the fill material and etching back the sacrificial layer and the fill material to produce an exposed portion of the segment.

The invention provides three-dimentional structure having conformal electrodes according the above-described methods. An embodiment 3-dimentional (3-D) structure includes a first layer and an array of pillars with cavity regions between the pillars, where each pillar includes a first end and a second end, where the first end is in contact with the first layer, where the first layer includes only one of an n material or a p material, where each the pillar includes an intrinsic material. A segment is located on the second end of each the pillar, where the segment includes the p material if the first layer includes the n material and where the segment includes the n material if the first layer includes the p material. Fill material is located in the cavity regions. A portion of the segment is exposed. The electrode is located on the fill material and on each exposed segment, thereby forming a conductive layer that provides a common contact to each exposed segment. A second electrode is located on the first layer.

The fill material may be a support material for supporting the pillars. The support material may be spin coated into the cavity regions. The support material can be selected from a photoresist, a polymer and a dielectric. In some embodiments, the fill material is a functional material, which may be, e.g., a neutron sensitive material which may be, e.g., selected from lithium fluoride, gadolinium and boron. In some cases, the 3-D structure is formed of Si. The neutron sensitive material includes a length sufficient to absorb neutrons propagating along the long aspect of any the cavity region, and may be sufficiently long to absorb all such neutrons. The pillar may have an aspect ratio within a range from greater than 5 to less than 500. The pillars are separated by less than the range of a mean free path of a charged particle produced within the functional material. Each cavity region has a diameter that is less than the range of at least one neutron reaction-produced particle produced within the functional material.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 1A depicts a three-dimensional device structure, consisting of a monolithic substrate of one material, with an array of high-aspect ratio pillars with cavity regions etched between the pillars.

FIG. 1B depicts a three-dimensional structure with an array of high aspect ratio pillars, whose cavities regions contain a second material, which serves as an active (i.e., functional) region or as a support (i.e., passive) region.

FIG. 1C depicts the structure of FIG. 1B with conformal electrode coatings on opposing surfaces forming a compact sensor of an electronic device.

FIG. 3 shows a scanning electron microscope image of a Si pillar structure, whose pillars are ≈2 μm×2 μm in cross section, with a height of ≈45μm.

FIG. 4A shows the first step in fabricating high-quality conformal electrode using planarization techniques with a support fill material. The basic as-etched structure is shown, with an array of high aspect ratio pillars.

FIG. 4B shows the second step of the process, whereby the basic array structure is coated with a support (passive) material, such as a spin-on glass layer.

FIG. 4C shows the third step of the process, whereby the support material is back etched and planarized until the pillar top surfaces are barely revealed.

FIG. 4D shows the fourth step of the process, whereby a conformal material, such as a full surface electrode is deposited onto the exposed pillar surface, forming the upper electrode of the device.

FIG. 10A shows the first step in fabricating a high-quality conformal electrode using planarization techniques with a functional fill material and a sacrificial layer for improved surface morphology. The basic high aspect ratio Si pillar structure is shown, as-coated with the functional fill material (e.g., $^{10}$B). Note the bump pattern resulting from the conformal $^{10}$B coating onto the pillar array.

FIG. 10B shows the second step of the process, whereby the functional material is back-etched and planarized until the pillar top surfaces are barely revealed.

FIG. 10C shows the third step of the process, whereby the overall array structure is coated with a sacrificial material, such as a spin-on glass layer or photoresist or polymer.

FIG. 10D shows the fourth step of the process, whereby the sacrificial material is back-etched and planarized until the pillar top surfaces are barely revealed.

FIG. 10E shows the fifth step of the process, whereby a conformal material, such as a full-surface electrode metallization is deposited onto the exposed pillar surface, forming the upper electrode of the device with improved surface morphology.

FIG. 11A shows a SEM image of the first step of a sacrificial layer back-etch planarization process progression, with the goal to deposit a top-surface conformal electrode to the pillar structure. In this figure, a SEM image of a Boron-coated Si-pillar structure is shown.

FIG. 11B shows a SEM image of the second step of a sacrificial layer back-etch planarization process progression. In this figure, a SEM image of a Boron-coated Si-pillar structure, after etch back, is shown. Note the scale size of the surface irregularities, which is on the order of ≈1 μm or greater (a good estimate of the defect size can be appreciated when one considers that the pillar diameter is ≈2 μm, which is easily resolvable).

FIG. 11C shows a SEM image of a Boron-coated Si-pillar structure after etch back and polymer planarization. Note the high-quality of the surface morphology, especially, when compared against that of the Boron etch-back image in FIG. 11B.

FIG. 11D shows a SEM image of a completed Boron-coated Si-pillar structure after deposition of a conformal electrode, which, in this case, is thin-film Al metallization across the entire surface of the pillar array device.

FIG. 12A shows a schematic of a Boron-coated pillar structure.

FIG. 12B shows a schematic of a Boron-coated pillar structure after coating of a sacrificial layer.

FIG. 12C shows a schematic of a Boron-coated pillar structure after coating of a sacrificial layer and etch-back planarization.

FIG. 12D shows a schematic of a Boron-coated pillar structure with etched self-aligned via-holes.

FIG. 12E shows a schematic of a Boron-coated pillar structure with etched self-aligned via-holes after removal of excess sacrificial layer material.

FIG. 12F shows a schematic of a completed Boron-coated pillar structure with self-aligned via-holes after deposition of a conformal electrode across the entire pillar array structure.

FIG. 13A shows a schematic of a Boron-coated pillar structure.

FIG. 13B shows a schematic of a Boron-coated pillar structure after coating of a etch-matched sacrificial layer.

FIG. 13C shows a schematic of a Boron-coated pillar structure of FIG. 13B, after matched-rate etch-back planarization of the combination of $^{10}$B and the sacrificial layers.

FIG. 13D shows a schematic of a Boron-coated pillar structure after matched-rate etch-back planarization to reveal the tops of the pillar array.

FIG. 13E shows a schematic of a completed Boron-coated pillar structure after deposition of a conformal electrode.

DETAILED DESCRIPTION OF THE INVENTION

Figure 2C:
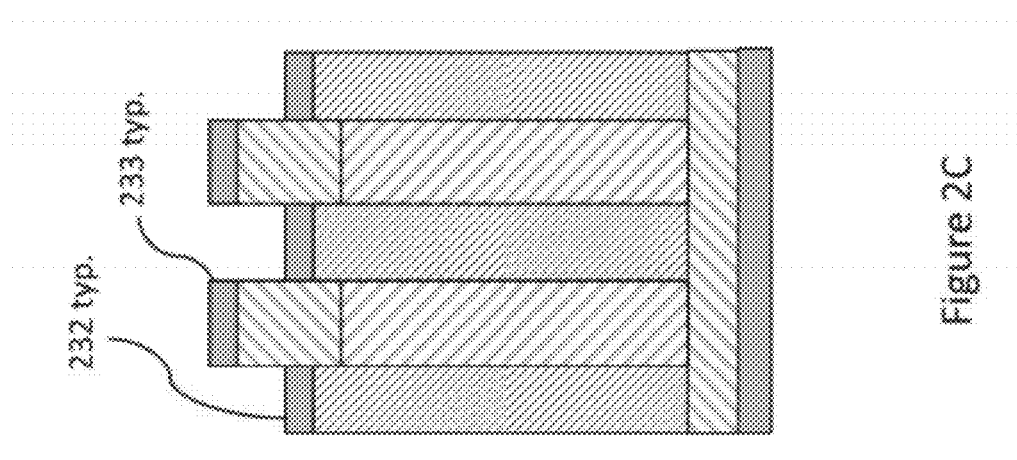
FIG. 2C shows an open-circuit failure mode of a p-i-n diode pillar structure.

Three-dimensional structures for micro- and nano-electronics are under investigation for a number of uses. Applications include thermoelectrics, catalysts, sensors, including thermal neutron and radiation detectors, energy storage devices such as batteries and ultra-capacitors, solar cells, photonic and phononic crystals, image converters and intensifiers, acoustic transducers and smart, reconfigurable materials. These three-dimensional structures may be filled, either with a functional material—such as a catalyst or sensing material, be it electrical, optical or acoustical or a combination thereof—or with a support material, which is not active in the device, but is necessary for support and stability of the structure. In either case, a blanket coating is subsequently applied across the filled structure, to provide a global electrode or transducer for device operation.

Given the non-uniform morphology of such as-grown structures, it is necessary to first process and planarize the multi-material surface matrix prior to the deposition of the blanket coating. It is a goal of this invention to teach fabrication processes and planarization methods to enable high-yield, uniform and reliable conformal blanket coatings to be realized across the surfaces of such high-aspect ratio structures.

Full-wafer planarization has been done successfully by chemical mechanical polishing (CMP). However the aspect ratio of the features being planarized is typically small, in many cases with a ratio on the order of 1:1. Spin-on-glass (SOG) has also been developed for relatively shallow structures used for trench isolation, and interlayer metal interconnect. SOG can have difficulties with cracking, gaps and surface smoothness and low viscosity. Some spin coating photoresist in conjunction with a plasma etch-back has also been used to planarize 2 µm deep trenches and similarly tall nanowires.

It is a goal of this invention to teach methods to planarize high-aspect ratio monolithic structures with etched arrays of pillars with aspect ratios in the range of 10:1 to 100:1 with an average of 25:1 so that a single, large-area, conformal blanket of metallization, as an example, can be coated across the tops of the pillars, thereby forming a common electrode. An example of such a structure is a Si wafer, comprised of an etched array of pillars, with each pillar fabricated as a p-i-n diode and filled with a suitable material. Simply etching back the top surface of such a high aspect ratio complex structure can result in a number of problems, including poor-quality blanket coatings, as well as either open circuits or short circuits of the underlying electronic matrix.

Deposition of conformal, blanket electrodes on uncoated and coated three-dimensional structures can be a challenge due to the uneven morphology of the coating. This is the case since the top surface of a typical device consists of an array of Si pillars, with a high aspect ratio, and with the inter-pillar cavity regions between pillars filled with, e.g., $^{10}$B. Hence, the as-grown device can have variations in surface morphology, pillar height, and filled-cavity material variations. A necessary condition to realize high-yield devices with consistent performance and lifetimes, is that the surface morphology of the structure be uniform, with minimal irregularities and defects.

This invention teaches several methods to planarize such high-aspect-ratio devices to minimize variations in the morphology that are typically present in the as-grown structures. By proper planarization, robust, conformal-coated materials, such as electrodes, transducers, or other material depositions, can be grown on the structures with consistent reproducibility and with high yield.

The fabrication processes taught herein have the capability to ensure a uniform surface for deposition of electrodes for devices including $^{10}$Boron filled p-i-n pillar-structured diodes. The first discussed technique allows for coating of structures with topography through the use of a planarizing photoresist followed by reactive ion etching (RIE) back to expose the tops of the pillar structure. The second discussed technique also utilizes photoresist, but instead allows for planarization of a structure in which the pillars are filled and coated with a conformal coating by matching the etch rate of the photoresist to the underlying layers. Each fabrication process uses, e.g., S1518 photoresist in order to achieve a relatively uniform surface despite the non-uniformity of the underlying detector. Both processes allow for metallization of the final structure and provide good electrical continuity over a 3-D pillar structure.

A schematic drawing of a general three-dimensional structure 100, in cross section, is shown in FIG. 1A. It consists of substrate 110, etched to form an array of pillars, 115, with inter-dispersed cavity regions (the gaps between the pillars) 120. The substrate can be in the form of a semiconductor material, quartz, or other suitable medium. Inter-dispersed in the regions between the pillars is a second material 125, as shown in FIG. 1B. This second material 125 can be active (i.e., functional) or passive (i.e., supporting, insulating, isolating, etc.). Furthermore, the material can be an atomic or molecular medium (e.g., Boron), a polymer, semiconductor, dielectric, etc. In general, the aspect ratio of the structure, namely, the ratio of the height of the pillars relative to its width and/or pitch can vary from about 1:1 to 1000:1, and, typically, in the range of 10:1 to 100:1, depending on the specific application (sensing, detection, transduction, etc.) and, further, constrained by the material/environmental constraints (mechanical, thermal, vibrational, etc.). The pillar width and/or cross section dimensions, as well as the pitch, in one or both lateral directions can, in general, be arbitrary, depending on the specific end-user requirements.

Typically, the lower surface of structure 100, depicted by cross section A-A in FIG. 1B, consists of a single material, which is a substrate of the overall structure. This surface, therefore, can be processed by a variety of techniques known in the art to achieve a high-quality surface morphology, including mechanical, chemical and ion beam polishing, plasma etching, planarization, etc.

The upper surface of structure 100, depicted by cross section B-B in FIG. 1B, consists of several different materials, whose mechanical and compositional properties can differ in general. As an example, it can be in the form of a pattern of substrate material 115 and inlay material 125. The processing and preparation of this upper surface constitute the basic embodiments of this invention. One goal is to enable robust, planar deposition of yet another material, with superior adhesion and integrity, as well as consistent mechanical, physical and material properties typical of the bulk material, which can include electrical, acoustic, optical and thermal parameters.

The general structure 100, as shown in FIG. 1C, can also be fabricated with a planar coating of yet another support or functional material, deposited on the upper and/or lower surfaces of the device, depicted as 130 and 140, respectively. As an example, the material can be a metallic coating to form electrical contacts, in the case of a sensor or detector. In the case of an acoustic device, the coatings can be in the form of a piezoelectric material for transduction, etc. Conventional deposition techniques, known in the art, can be utilized to form the desired coating 140 on the lower surface of the support structure 110. Since the lower surface is planar, and comprised of a single, uniform material, e.g., Si, processing techniques to achieve high-quality planarization and metallization steps of the fabrication process are well known in the art.

However, deposition of the upper coating 130, is not straightforward. This follows, since the upper surface of the basic structure 100 consists of different materials, and, more importantly, configured as high-aspect ratio support pillars and high-aspect ratio deposited materials. Hence, the surface morphology of the composite upper surface will not, in general, be ideal to support, and faithfully maintain and preserve, the electrical, optical or transductive properties of a relatively thin, conformal deposited layer of coating material 130 over a specified device lifetime. It is this critical need that underlies the embodiments described herein.

Returning to FIG. 1B, the fill material 125 can be a functional material such as a sensor or catalyst while a support material is defined as one that is not active in terms of the device functionality. In either case, the fill material 125 is necessary for stability of the structure and for deposition of blanket coatings. An example of a sensor that utilizes a functional material is a thermal neutron detector. In this case, the substrate material 110 is comprised of an array of three-dimensional p-i-n Si diode pillars 115, and the cavity regions 120 are filled with a functional material 125, an example of which is isotopically enriched $^{10}$Boron.

In order to realize functionality and reliability of many classes of devices, as well as similar three-dimensional structures for other uses, it is necessary to deposit a global electrical contact, interconnecting the tops of the pillar-arrayed structure. As an example, the top region of each Si pillar 115 can consist of a p+ layer of a p-i-n diode. Achieving a blanket, conformal coating (e.g., a highly conductive thin film of metallization) for global electrical summation of all the signals from all the active pillar regions can be difficult, due to non-uniform topography across the upper surface of the device structure. Without methods to optimally prepare, process and planarize the upper surface of the structure, depicted as section B-B in FIG. 1B, a loss in device functionality and robustness can occur.

Figure 2B:
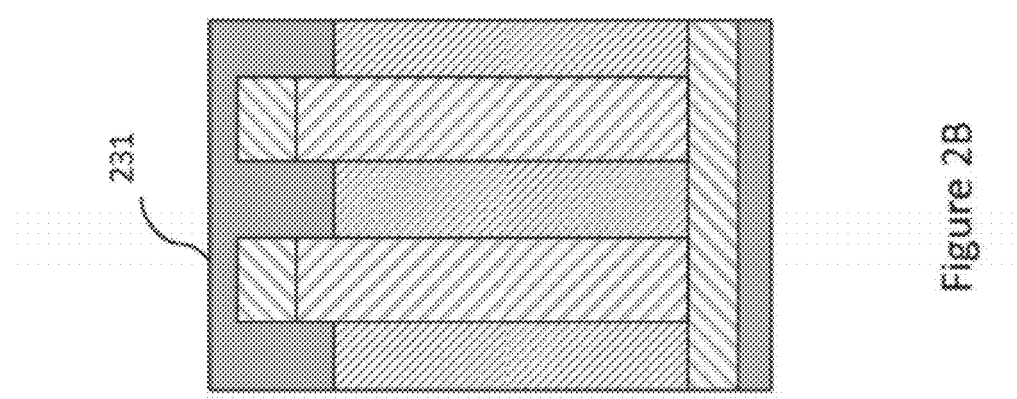
FIG. 2B shows a short-circuit failure mode of a p-i-n diode pillar structure.
Figure 2A:
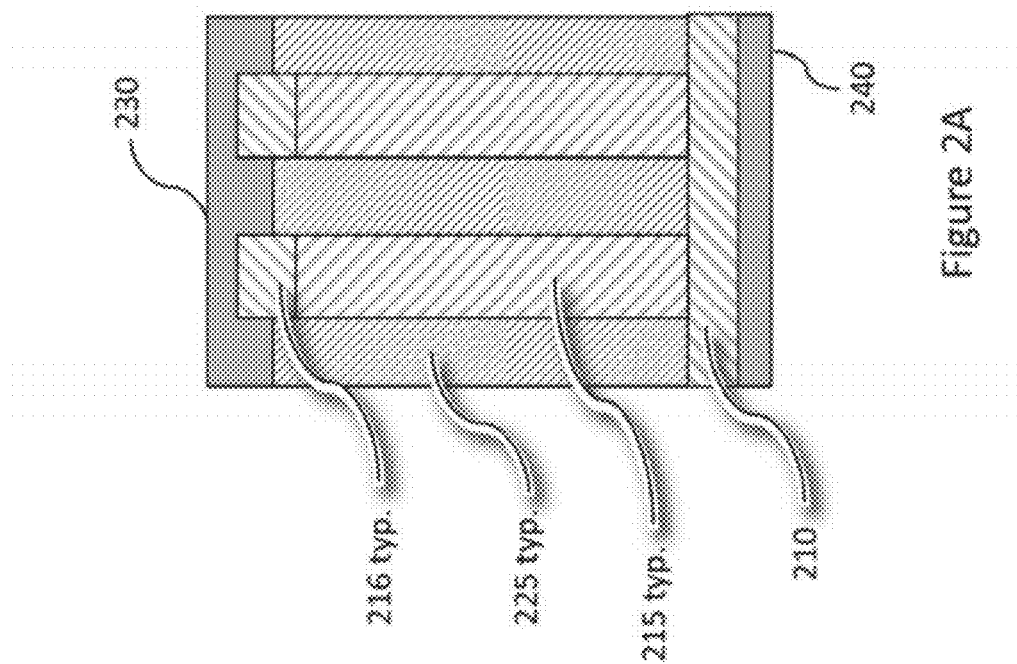
FIG. 2A shows a functional p-i-n diode pillar structure with a properly configured conformal electrode or transducer, providing a conductive or transductive connection across the respective top surfaces of the array of respective pillars. A second, thin-film electrode or transducer is deposited on the bottom surface of the substrate.

FIG. 2 shows drawings of a typical 3-D structure to illustrate how variations in the etching and planarization processing of a device can result in electrical failure modes of a conductive top-electrode layer. The figures shows drawings of the surface morphology of a properly fabricated 3-D device, in FIG. 2A, a short-circuited device, in FIG. 2B, and a device with an open circuit, in FIG. 2C. This basic structure is that of a thermal neutron detector, which consists of a Si substrate 210, with Si pillars in the form a p-i-n diode array (this discussion also applies to n-i-p diodes, etc.). A typical pillar diode consists of a p+ region 216, an intrinsic region 215, with the substrate serving as the n+ layer. Isotopically enriched $^{10}$B, 225, is deposited in all the Si cavity regions and serves as the neutron interaction zones. A conductive layer 240 is deposited on the bottom surface of support structure 210 and forms the lower electrode. The lower surface of the support structure is assumed to have excellent surface morphology, using processing techniques well known in the art.

The electrical functionality of the device is highly dependent on the performance and integrity of the upper electrode, which is governed, in large part, by the surface morphology of the upper material matrix. A properly configured device is sketched in FIG. 2A, in which the upper electrode 230 is in electrical contact with only the p+ region 216 of the Si pillars. (Contact of the electrode with the upper surface of the $^{10}$B is only critical in terms of support and the mechanical properties of the adhesion of the bond interface; the electrical properties in this case are inconsequential.) The blanket upper electrode layer 230, in conjunction with the lower electrode contact 240 electrically couples all the p-i-n diodes in the array in a parallel configuration.

Two different electrical failure modes of the device are depicted in FIGS. 2B and 2C. In the former case, FIG. 2B, the device fails due to an electrical short-circuit amongst the Si diode pillars. The short results from the upper electrode conductive layer 231 electrically contacting both the p+ and intrinsic layers of all the diodes in the array. Physically, the source of the failure mode stems from the differential height of the Si pillar and the $^{10}$B regions being sufficiently large and, moreover, that the electrode layer thickness exceeds this height differential. Thus, the electrode layer can form a conductive path from the p+ region to the intrinsic region along the walls of the pillar array.

In the latter case, FIG. 2C, the device fails due to an electrical open-circuit. The open-circuit results from the differential height of the Si pillar and the $^{10}$B regions being sufficiently large and, moreover, that this height differential exceeds the thickness of the electrode layer. Thus, the each p-i-n Si pillar diode is electrically isolated from all other pillar diodes. This follows, since the conductive layer that coats the upper surface of each respective p-i-n diode in the array, 233, and the conductive layer that coats each adjacent $^{10}$B upper surface 232 do not form an overall conductive path across the entire upper surface of the 3-D device. In this case, most, if not all, of the diodes in the detector array do not contribute to the desired output signal. Therefore, it is clear that the surface morphology, as well as the planarization processing techniques, is both critical in terms of the device performance, yield and lifetime.

As noted above, two general planarization techniques for high-aspect ratio three-dimensional pillar structures (such as those comprised of p-i-n diodes) are described herein, which enable a continuous coating of metallization on the top of the structures. The first technique allows for coating of structures with topography through the use of a planarizing photoresist followed by RIE etch back or lapping (chemical mechanical polishing) to expose the tops of the pillar structure. The second technique also utilizes photoresist, but instead allows for planarization of a structure in which the pillars are filled and coated with a conformal coating by matching the etch rate of the photoresist to the underlying layers. These techniques enable deposition using sputtering, thermal or electron beam evaporation of metal films to allow for electrical contact to the tops of the underlying pillar structure. These fabrication processes have application to many devices comprised of 3-D high aspect ratio structures.

The starting point for each processing technique begins with a 3-D structure with high-aspect-ratio pillars, similar to that illustrated in the drawings discussed in reference to FIG. 1A above. FIG. 3 shows a SEM image of one such monolithic structure 300 comprised of Si, which is typical of this invention. The figure shows a micrograph of a Si wafer 310, which is etched to form an array of Si pillars 315 that constitutes the support structure of a sensor, such as a thermal neutron detector. High-aspect-ratio Si pillars are fabricated by etching a Si wafer 310 using techniques such as deep reactive ion etching (DRIE), with the array pattern defined by a photolithographic mask (not shown). In this example, the height of each Si pillar 315 in the array is ≈50 μm, with a cross section of ≈2 μm×2 μm. The gap, or cavity regions, 320 between the pillars 315 in this example is ≈2 μm. Hence, this structure has an aspect ratio of 25:1, with a pitch of 4 μm. As will be shown below, this support structure forms an array of p-i-n diodes, with $^{10}$B subsequently deposited in the gaps, or cavity regions, between the Si pillars, resulting in a solid-state, compact, rugged, high efficiency neutron detector. Electrodes (not shown in Figure) are then deposited on the bottom surface of the substrate 310 and atop the Si pillar/$^{10}$B structured array, as depicted in FIG. 1C, which provides signal output contacts for the detector.

Technique 1. Conformal Layer Processing Using Planarization Methods 1.0 Planarization with Etch-Back of the Fill Material The first technique is applicable to three-dimensional structures filled with either a "support material"—in which case the basic comb-like pillar structure is the sole active medium, while the material between the pillars, if any, is passive and performs the function of structural support and is not active in the device functionality—or to structures filled with a "functional material," an example of which is $^{10}$B in the case of a thermal neutron sensor.

A schematic of the etch-back fabrication technique, as applied to a structure filled with either a support material or a functional material is shown in FIG. 4A, where 410 is the three-dimensional structure with pillars 415 and cavity regions 420 between the pillars. High aspect ratio devices for planarization can be prepared by, e.g., Deep Reactive Ion Etching DRIE, RIE, ion beam etching, wet chemical etching or by growth (e.g., chemical vapor deposition).

FIG. 4B depicts the second step in the processing, which, in the case of a support material, entails the spin coating of a photoresist (or, e.g., a photoresist or a polymer or a spin-on dielectric) 440 onto the upper region of the basic comb-like structure; or, in the case of a functional material, entails the deposition of the said material, such as $^{10}$B. After doing so, the high aspect ratio structures will have the filling material (be it supportive or functional) both in and on the structure. As shown in FIG. 4C, the high-aspect ratio structure is then etched using plasma or ion beam etching or lapping to remove the photoresist (polymer or spin-on dielectric) in the former case, or the functional material in the latter case, so that the pillar posts are revealed. After etching of the device, the remaining filling material layer will have a thickness less than the height of the pillars. As shown in FIG. 4D, an electrode is then deposited with a thickness sufficient to coat the protruding pillars, thereby forming a conductive layer that provides a common contact to the entire pillar array. The specific thin-film deposition technique employed is a function of the device materials and can include electron beam evaporation, thermal evaporation, electroplating, sputtering, CVD, PECVD, ALD, electroplating, electro-less plating or electrophoresis.

1.1. Planarization with Etch-Back of the Supportive Filling Material

To demonstrate this technique, samples for planarization were prepared by masking Si wafers with photoresist using standard photolithographic processes, resulting in a structure with a ≈2 μm×2 μm square pillar pattern with approximately 2 μm spacing between pillars (a pitch of 4 μm). The vertical pillars were etched to depths of 16, 28, and 45 μm to obtain aspect ratios of 8:1, 14:1, and 22:1, using Deep Reactive Ion Etching (DRIE) in a Surface Technology Systems (STS) Silicon Etcher. Unfilled pillars were then coated using Shipley S1518 photoresist as a support material to fill in the etched areas of the basic structure. The S1518 was spun onto the sample using an initially slow speed of 500 rpm for 60 seconds followed by a secondary, faster spin speed of either 1500, 2500, or 4000 rpm for 60 seconds. The slow initial spin is necessary to spread the photoresist over the sample and allow it to flow into the etched areas, while the higher speed spin results in a relatively uniform coating over the top of the pillars.

Figure 5:
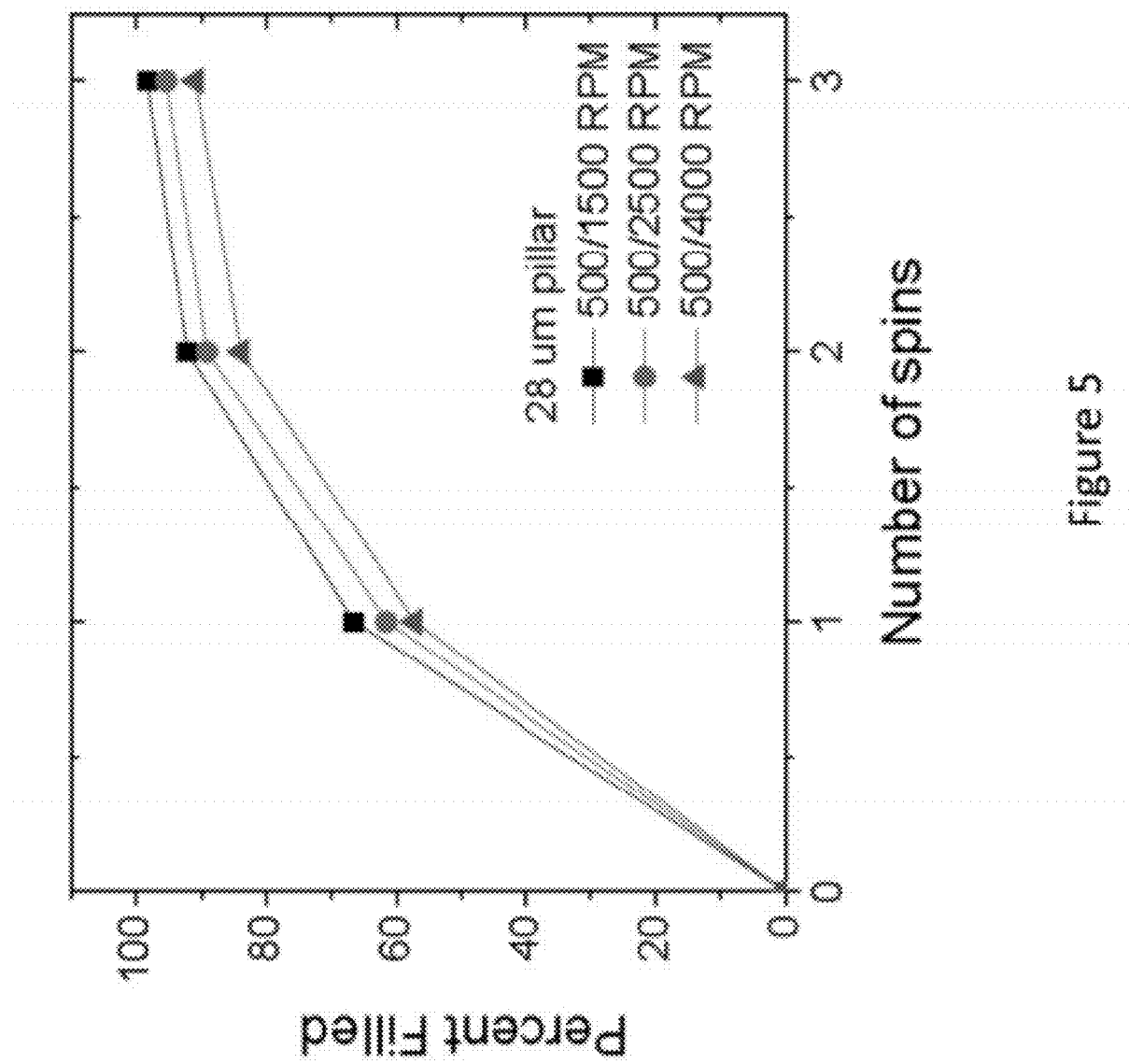
FIG. 5 shows the fill factor as a percentage of the pillar height vs. number of spins for 28 μm pillars for varying secondary spin speeds of photoresist.

FIG. 5 shows the fill factor as a percentage of the pillar height vs. number of spins for 28 μm pillars for varying secondary spin speeds. The fill factor is calculated as the percentage of the feature height filled by the photoresist. A secondary spin speed of 1000 rpm was not sufficient to achieve a planar coating of photoresist. All spin speeds examined yield a high fill factor after only three coatings, which is a reasonable number for such deep structures.

Figure 6:
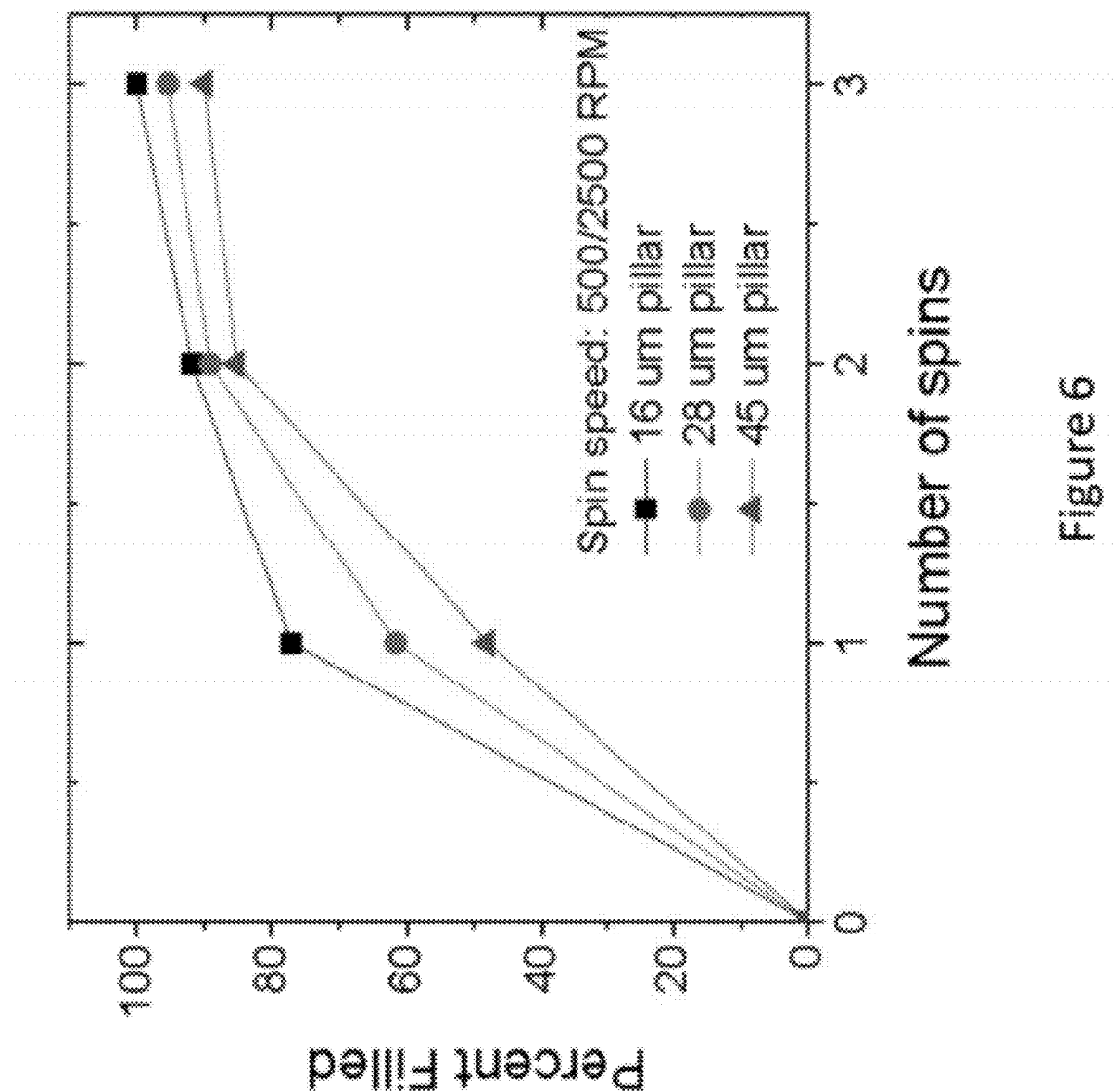
FIG. 6 shows the fill factor as a percentage of pillar height vs. number of spins for varying pillar heights, all cases with the same spin speed of 500/2500 rpm.

FIG. 6 shows the fill factor as a percentage of pillar height vs. number of spins for varying pillar heights with spin speed of 500/2500 rpm. Note that for all heights, only three spins are sufficient to achieve a high degree of filling.

Hard baking the photoresist after each spin on a hotplate was necessary to maintain the integrity of the planarity after metal deposition. Baking conditions that resulted in good planarity and surface quality were as follows: 75° C. for 60 seconds, 95° C. for 120 seconds, 110° C. for 120 seconds, and ramp to 200° C. and hold for 300 seconds. On the other hand, photoresist cured at only 120° C. or 150° C. displayed a large number of cracks, which is prevented by bake at 200° C.

1.2 Planarization with Etch-Back of the Functional Filling Material

A similar technique has been demonstrated to planarize pillars, filled with a functional material, which could include materials such as $SiO_2$ or $SiN_x$. However, for this demonstration (and, for subsequent device evaluation), low-pressure chemical vapor deposited (LPCVD) $^{10}$Boron was used as the functional fill material, with the goal to fabricate a novel, compact, solid-state thermal neutron detector.

Figure 7:
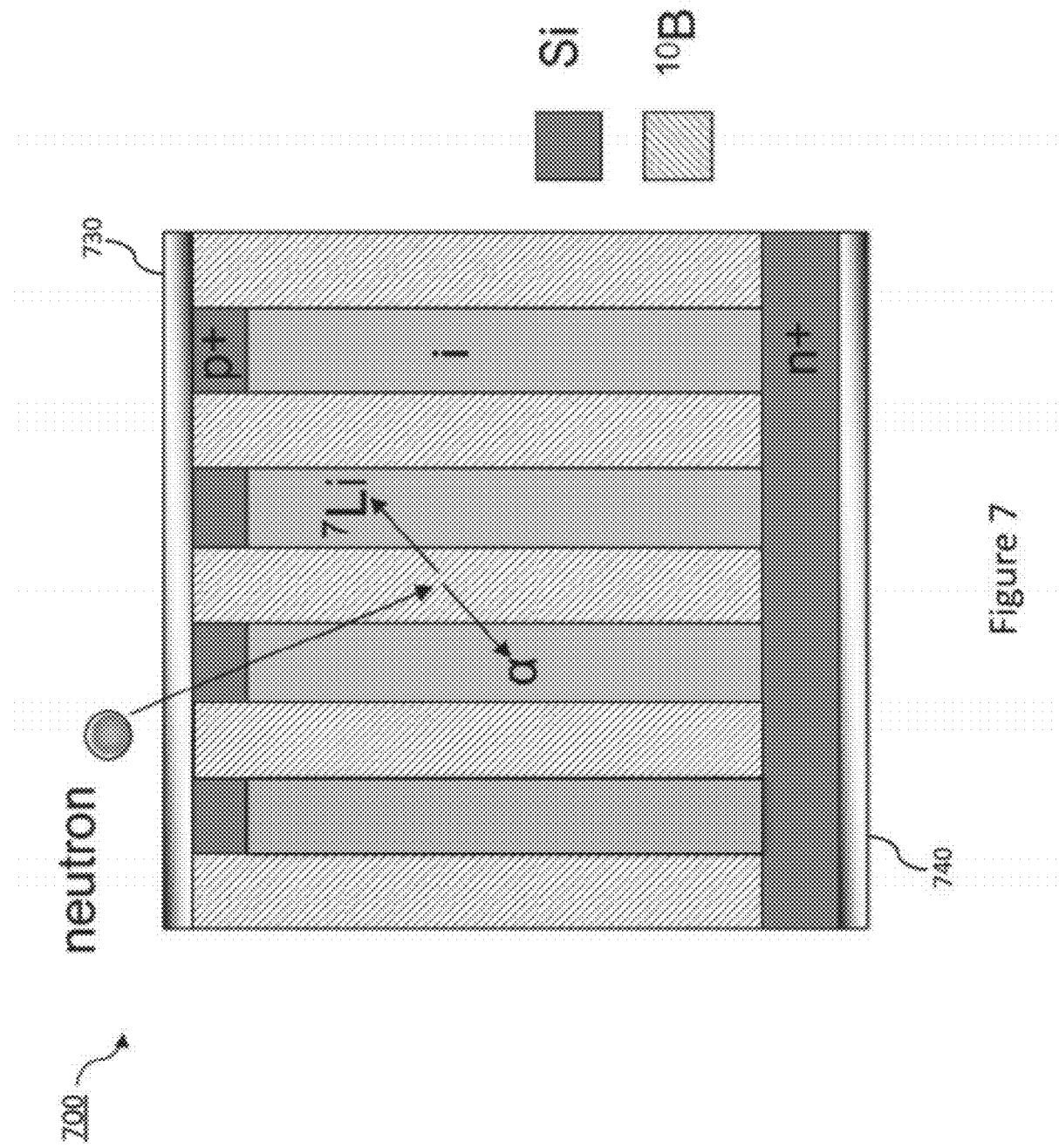
FIG. 7 shows a schematic of a pillar-structured, solid-state thermal neutron detector. The basic detector geometry enables the optimization of two physical detector mechanisms: (1) A relatively long interaction length (≈50 μm in the longitudinal direction along the length of the $^{10}$B fill material) for the incident thermal neutrons to interact with the $^{10}$B, to optimize the generation of the decay products—an alpha particle and a $^7$Li particle; and (2) A relatively short interaction length (≈2 μm in the lateral direction) for the alpha and $^7$Li decay products to interact with the Si pillars, to optimize the generation of electron-hole pairs in the Si p-i-n pillars for detection of the neutron event.

This device, which benefits from the teachings of this invention, is shown in FIG. 7, and functions as a solid-state thermal neutron detector 700. The device function and operating principles are summarized henceforth for completeness.

The sensor is comprised of $^{10}$B layers that possess relatively high cross sections for thermal neutron interactions. A key neutron-Boron interaction channel results in the generation of alpha and $^7$Li particles. These particles subsequently interact in the Si p-i-n diode pillars to produce electron-hole pairs, which are then detected via the generation of current, as sensed by the pair of electrodes, 730 and 740, that bound the overall structure.

The specific design rules for this class of detector are not relevant vis-à-vis the teachings of this invention. Nonetheless, it serves as a good example in terms of its performance, which is highly dependent on quality of the basic 3-D pillar structure, the morphology of the walls of the pillars, the interface of the functional fill material with the Si pillars, the integrity and morphology of the full-surface conformal electrode, etc. Suffice it to say that a 3-D structure comprised of high aspect ratio Si pillars, with alternating $^{10}$B functional materials results in a rugged and compact thermal neutron detector with high sensitivity and conversion efficiency. In the demonstration that follows, a structure with these materials is fabricated and its thermal neutron detection performance evaluated. The results are indicative of the quality and reliability of the processing techniques described herein.

Figures 8A, 8B, 8C:
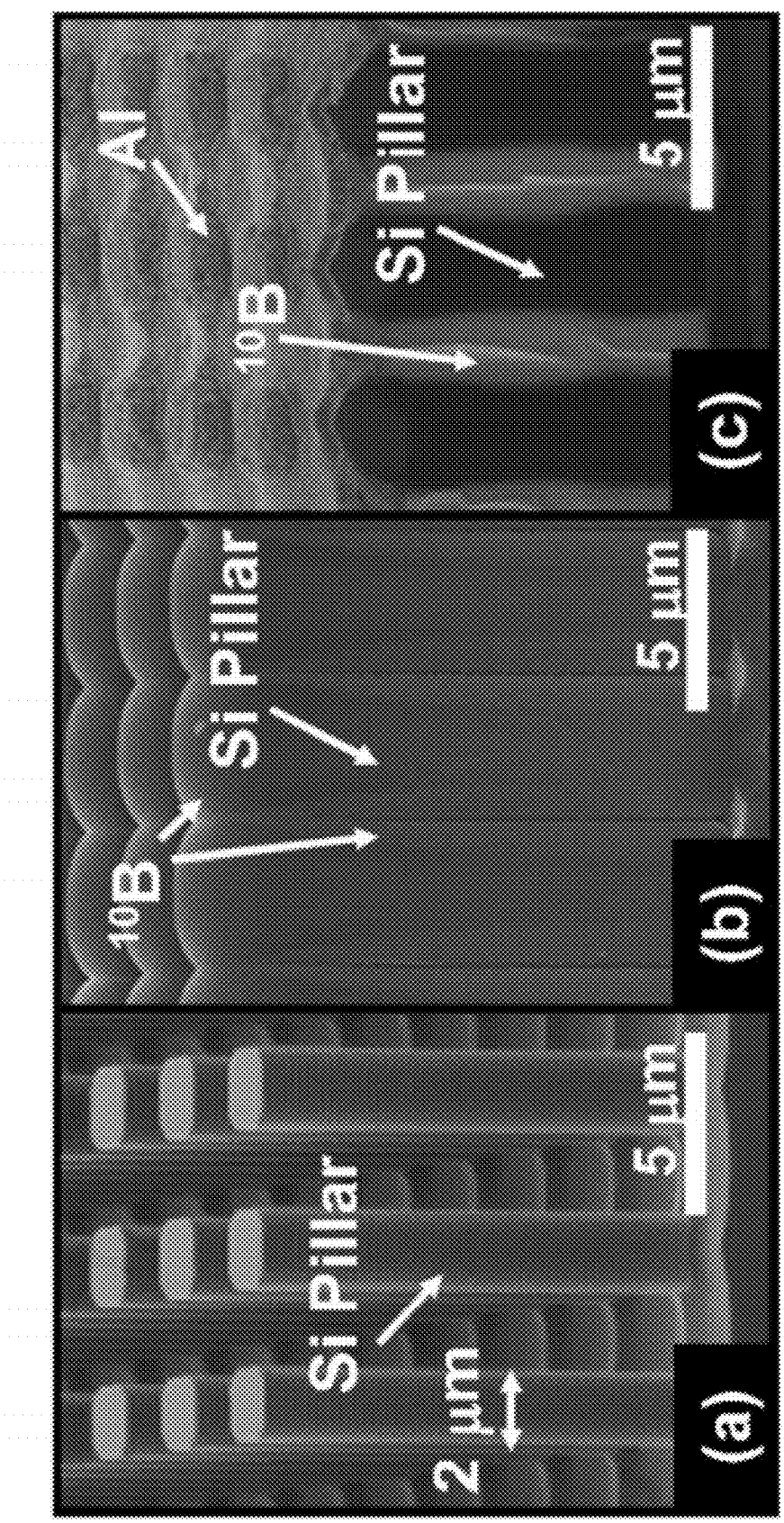
FIG. 8A shows a SEM image of a 12 μm Si pillar structure as fabricated by etching a Si substrate.
FIG. 8B shows a SEM image of a 12 μm Si pillar structure after $^{10}$B deposition.
FIG. 8C shows a SEM image of a 12 μm Si pillar structure after etching of excess $^{10}$B and evaporation of a conformal surface aluminum electrode.

The fabrication process of the structure shown in FIGS. 8A, 8B and 8C began by epitaxially growing p+ and i layers on a n+ silicon substrate by using an ASM Epsilon chemical vapor deposition system. The pillar diameter and spacing was then defined lithographically, followed by plasma etching $SF_6$ as a working gas, to create a high aspect ratio structure. FIG. 8A shows a micrograph of the etched Si pillar array structure, which, in this case, consists of pillars that are 12 µm in height, with a cross sectional area of 2 µm×2 µm, or, an aspect ratio of 6:1 (we have since fabricated similar Si structures with aspect ratios of ≈25:1). A conformal coating of $^{10}$B was then deposited on the pillar array by chemical vapor deposition, as shown in FIG. 8B. Next, the "etch back" was carried out using a Plasma Quest electron cyclotron resonance etching system with a tri-source gas mixture to expose the p+ layer for contact formation. Lastly, aluminum was sputtered onto the structures to fabricate the electrodes, as shown in FIG. 8C.

Figure 9:
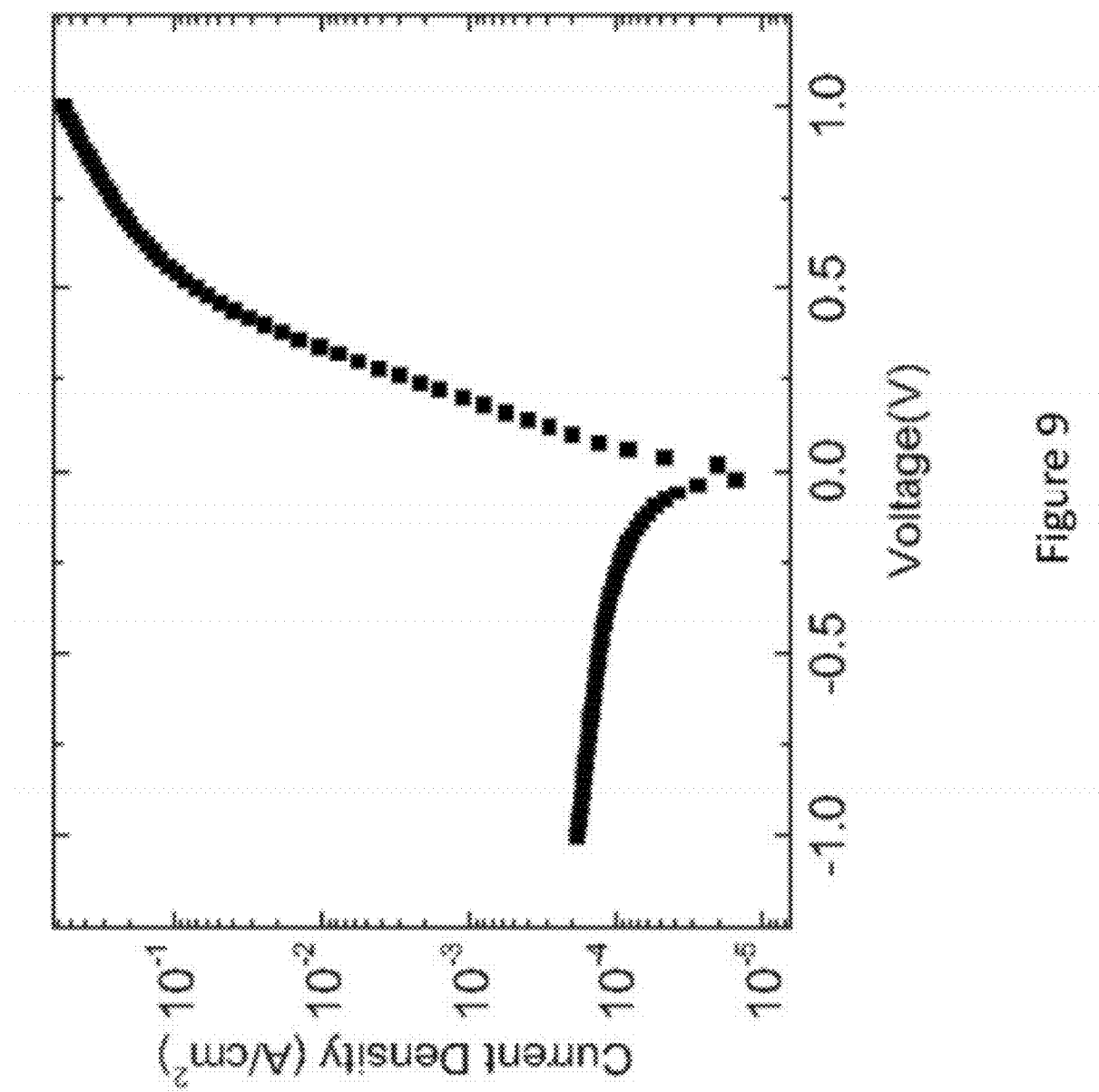
FIG. 9 shows a current vs. voltage measurement of a 12 μm Si pillar structured thermal neutron detector.

The quality, uniformity and morphology enabled by this processing technique is paramount to the operation and detection efficiency and sensitivity of the neutron detector, which is revealed by the electrical and radiation detection characterization of the detector. Current versus voltage measurements illustrate a low reverse-bias current density of $1.8 \times 10^{-4}$ $A/cm^2$ measured at $-1$ V, with the results shown in FIG. 9. Low leakage current is essential for high sensitivity to neutron events because it sets the noise floor for the device. Radiation measurement results of this proof-of-principle device show 7.3+/−0.6% efficiency and $10^5$ neutron-to-gamma discrimination ratio with a pillar aspect ratio of 6:1.

This is the highest efficiency reported to date for a thermal neutron detector based on $^{10}$B without a stacking configuration. In a more recent demonstration, an efficiency of 22% was measured using a pillar structure with a 12:1 aspect ratio. Based on these measurements, it is predicted that a detector with a greater aspect ratio should result in an efficiency in the range of 50%, which would exceed that of commercially available $^3$He neutron detectors by more than a factor of 2.

1.3 Planarization with Etch-Back of the Functional Fill Material with a Sacrificial Layer Depending of the specific materials used to fabricate a given 3-D structure, the surface morphology of the etched functional material may not be of sufficient quality to enable reliable, reproducible, high-yield conformal coatings to be deposited onto the structure. In such cases, the surface quality can be improved by the addition of a sacrificial layer during the processing and planarization of the device.

In this approach to realize improved quality of a conformal electrode, via planarization of a sacrificial begins with the fabrication of the basic structure in a manner similar to that of FIG. 4A. Recall that this step of the fabrication process results in a substrate with an array of high aspect ratio pillars. Turning now to FIG. 10A, a functional fill material 1025, say $^{10}$B, is deposited onto the basic structure 1010. The structure is then etched to remove a sufficient amount of the fill material 1025 to expose the top of each respective pillar 1015 in the array, as shown in FIG. 10B. A necessary condition for this step is that the etch rate of the fill material 1025 be greater than that of the substrate structure 1010. Alternately, the same result can be achieved (exposure of the top of each pillar) by initially depositing a stop-etch layer, such as Al or $SiO_2$, on the surface of the structure 1010 prior to the deposition of the fill material 1025. The next step, as shown in FIG. 10C, is to coat the surface with a planarizing sacrificial layer 1040, such as a photoresist or polymer or spin-on-glass. The sacrificial layer is then etched and planarized until the tops of the pillars 1015 are initially exposed, as shown in FIG. 10D. The spatial regions between pillars will therefore consist of a fill material, on top of which is a thin layer of the sacrificial layer, the latter being inconsequential to the operation of the device in the case of a thermal neutron detector. Note that this process enables more effective control of the layer thicknesses, an example being that the thickness of the functional fill material is less than the height of the pillars 1015. Hence, the possibility of open-circuit or short-circuit failure modes is minimized. Furthermore, this planarization process results in a surface of superior morphology, so that the quality control of the conformal coating 1050, is improved, as shown in FIG. 10E.

Turning now to micrographs in FIGS. 11A to 11D, a sequence of the layer-layer etch-back processing steps are shown that result in a superior metallization coating, as described with reference to the drawings in FIG. 10A to 10E. In FIG. 11A, a micrograph is shown of an etched Si pillar array 1115 structure, coated with a Boron functional fill material 1125. In this case, the structure consists of pillars that are 12 µm in height, with a cross sectional area of 2 µm×2 µm, or, an aspect ratio of 6:1 (we have since fabricated similar Si structures with aspect ratios of ≈25:1.

Because of the conformal nature of the $^{10}$Boron deposition, the tops of the Si pillars 1115 are covered with a bump layer 1125, shown in FIG. 11A. It is necessary to remove this layer of $^{10}$Boron in order to make electrical contact to the underlying Si devices, which is done using an electron cyclotron resonance (ECR) plasma etcher. Due to the nature of this etch as well as the initial film morphology and non-uniformity across the sample, the resulting surface may possess topography that has a peak to valley distance on the order of 1 µm.

FIG. 11B shows a completed $^{10}$Boron etch, with the Si pillars 1116 protruding above the surrounding $^{10}$Boron, and with Boron filling the low-lying regions 1126 between the pillars. Metalizing this structure to form an electrode on the upper surface of the device can be problematic if the planarization step in the processing is incomplete, which can lead to either electrical shorts or opens. Recall from FIG. 2B, if too much photoresist is removed, the device is shorted and does not function properly. On the other hand, if not enough photoresist is removed to uncover the tops of the pillars, no electrical contact to the underlying device is achieved, as shown in FIG. 2C. In both cases, the functionality of the device is compromised. To minimize such failure modes, the structure is coated with a polymer sacrificial layer and planarized, with the result shown in FIG. 11C. The etch back of the polymer layer is processed using an $O_2$ Reactive Ion Etch (RIE) plasma or lapping. Note the superior surface quality of the thin layer of planarized polymer material 1140. In addition, note that the planarization process enabled the tops of the Si pillars 1117 to minimally protrude above the surface of the residual polymer layer. While this process leaves photoresist on the device, no observed penalty in device performance resulted from its presence. In the final processing step, as shown in FIG. 11D, a blanket conformal electrode is formed via metallization of a conductive layer 1150, such as Al, across the entire surface. Note the excellent surface morphology as well as the now-coated Si diode pillar array 1118. By removing just enough photoresist to uncover the tops of the pillars, blanket metallization is possible. This allows for full device functionality to be achieved.

1.4. Planarization using Self-aligned Via-holes with Etchback of a Sacrificial Layer This embodiment enables high-quality conformal coatings to be realized by augmenting the planarization of a sacrificial layer (as above), with the formation of an array of self-aligned via-holes onto the respective pillar array. The result of this fabrication procedure is improved device reliability and yield. This processing technique also minimizes failure modes by etching via holes directly to the top of the underlying structure.

The sequence of processing steps is shown in FIGS. 12A to 12F. As is the case of the procedure discussed above, and shown in FIG. 12A, one first fabricates a 3-D structure 1210 with an array of high aspect ratio pillars 1215, followed by deposition of a filling material 1225, such as Boron. As shown in the figure, the Boron will conform to the arrayed structure, resulting an array of bumps. The goal of this fabrication process is to planarize the fill material on the surface of the structure, and, further, to provide improved control of the conformal electrode to avoid failure modes. As shown in FIG. 12B, the next step in the process is to coat a 3-D device structure with a planarizing sacrificial layer, such as a polymer, photoresist or spin-on-glass, which is used as a sacrificial mask. Self-aligned vias can be etched by selecting wet or dry etch conditions such that the etch rate of the fill material 1225 is much greater than the etch rate of sacrificial layer 1240. It is preferable that the etch rate of the basic structure 1210 is minimal. Alternately, an etch-stop layer such as aluminum or silicon dioxide can be deposited on the pillar array prior to the deposition of the fill material. The device is then etched and planarized as sketched in FIG. 12C, with the resultant structure topology shown in FIG. 12D. Since the etch rate of the fill material exceeds that of the sacrificial layer, the material directly above the tops of the pillars, which is primarily fill material (recall FIG. 12C), will be etched down to the top of each respective pillar. On the other hand, owing to the surface shape of the conformal bumps, the regions on the upper surface, directly above the fill-material cavities 1270 will be primarily comprised of sacrificial material. Given the difference in etch rates of the coated layers 1225 and 1240, the result will be the formation of protruding fill material with some residual, relative to the pillars. The next step in the process is to remove the residual sacrificial layer, if necessary, as shown in FIG. 12E. Note that the tops of the pillars are exposed, while the fill-material regions extend above the plane of the top surfaces of the pillar array. The final step, as shown in FIG. 12F is the deposition of a conformal electrode, which can consist of a thin-film metallization layer.

Technique 2. Matched Etch-Rate Planarization

Turning now to FIG. 13, the second method to enable blanket, conformal electrode deposition involves applying a planarizing, sacrificial layer to the fill material coating and selecting etch conditions under which the two etch rates are approximately equal. In addition, it is preferable that the etch rate of the basic 3-D structure is minimal, or, as in the previous planarization processes, a stop-etch layer can be deposited onto the basic structure prior to deposition of the fill material. The sequence of processing steps is shown in FIGS. 13A to 13E. As is the case of the procedure discussed above, and shown in FIG. 13A, one first fabricates a 3-D structure 1310 with an array of high aspect ratio pillars 1315, followed by deposition of a filling material 1325, such as Boron. As shown in the figure, the Boron will conform to the arrayed structure, resulting an array of bumps. The goal of this fabrication process is to planarize the fill material on the surface of the structure so that a conformal electrode can be deposited onto the structure with high reliability, yield, and reproducibility. As shown in FIG. 13B, the next step in the process is to coat a 3-D device structure with a planarizing sacrificial layer 1340, such as a polymer, photoresist or spin-on-glass, which is used as to enable high-quality surface morphology and planarization.

Upon planarization and etching of the overall upper surface of the device, as shown in FIG. 13C, this method allows for the effective transfer of the planar top surface of the sacrificial layer 1340 to the surface of the fill material 1325. Because a flat surface is achieved, as shown in FIG. 13D, a blanket, conformal electrode can easily be deposited directly onto the fill material when the tops of the pillars 1315 are exposed, as depicted in FIG. 13E. Technical details of a demonstration of the etch-matching planarization technique follow henceforth.

By matching the etch rate of the photoresist with the $^{10}$Boron, a nearly flat surface without protruding pillar tops can be achieved. This is possible because variation in the photoresist thickness is minimal. For example, on bare Si samples typical of most devices of this size, and, ignoring edge effects, the variation in thickness of the sacrificial layer is less than 0.05 µm. This is an insignificant amount compared to the amount of variation across both the initial and final surfaces.

The goal of this process is to produce near-uniform pillar exposure across the detector area while significantly decreasing the divots between the pillars. Prior to etching, an adhesion promoter HMDS and photoresist S1518 are spun onto detector samples using the same spin speed and bake as previously discussed, as shown in FIG. 13B. One coating is sufficient for this purpose and results in ~2 µm thick layer. Nanospec measurements taken on 1.5×1.5 cm$^2$ silicon samples spun under the same conditions show a variation in thickness over the samples of only ~0.025 µm. It is necessary to obtain a photoresist coating that is continuous, without pinholes, and with minimal edge effects. Pinholes in the photoresist result in etch pits in the final surface and could result in shorting of the silicon pillar diodes. These etch pits can result in shorting of the pillar array if too deep or a non-continuous coating of final metal. They are the result of air expanding and escaping from the pillar structure during the final high temperature bake. It is thus necessary to remove this step. If edge effects extend to the detector area, thicker photoresist will result in uncovered pillars at the conclusion of the etch step. Edge effects can be minimized with careful application of photoresist during spin on.

Figure 14:
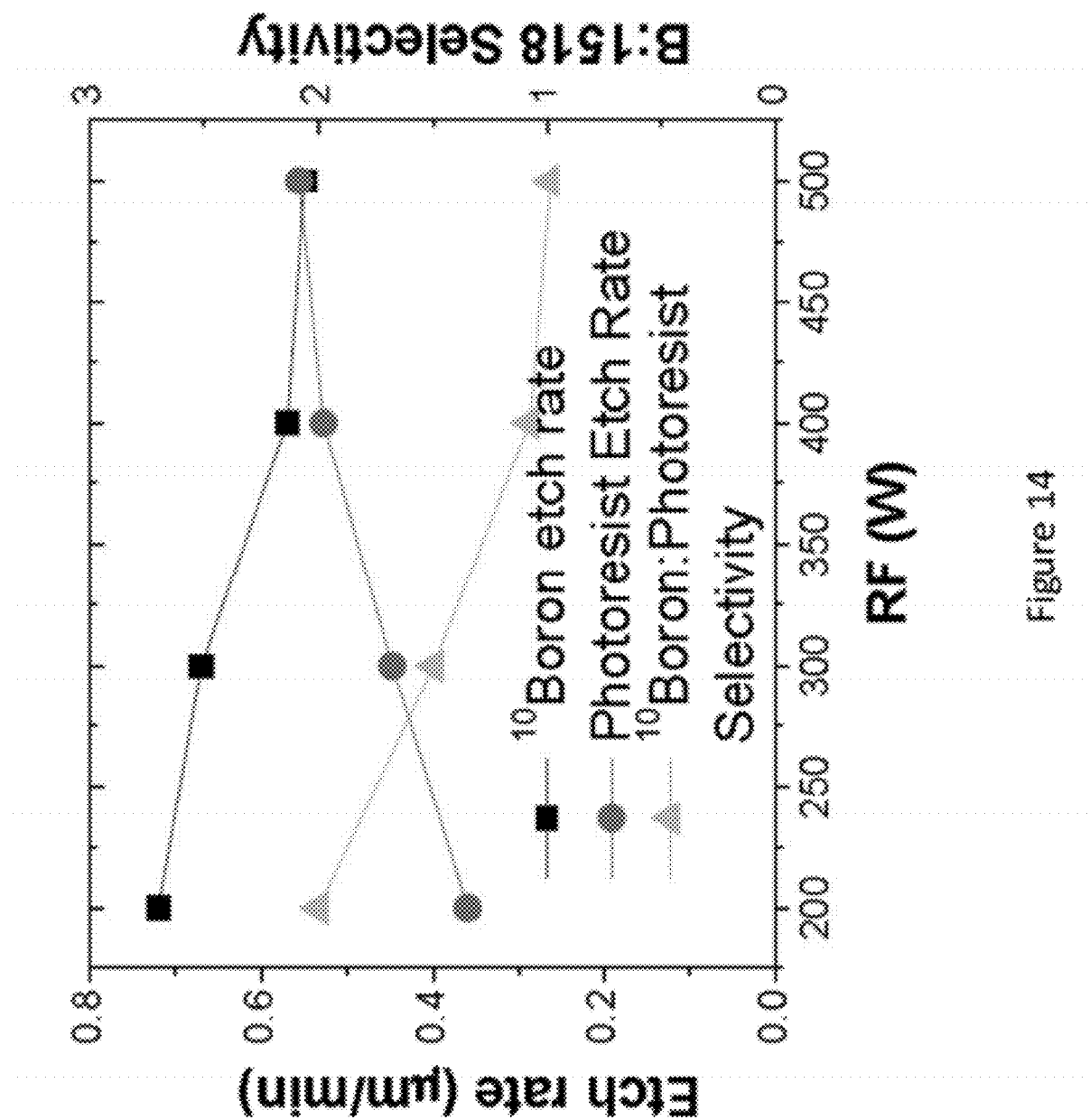
FIG. 14 shows the etch rates for $^{10}$Boron and S1518 to demonstrate matched etch rates.
Figure 15:
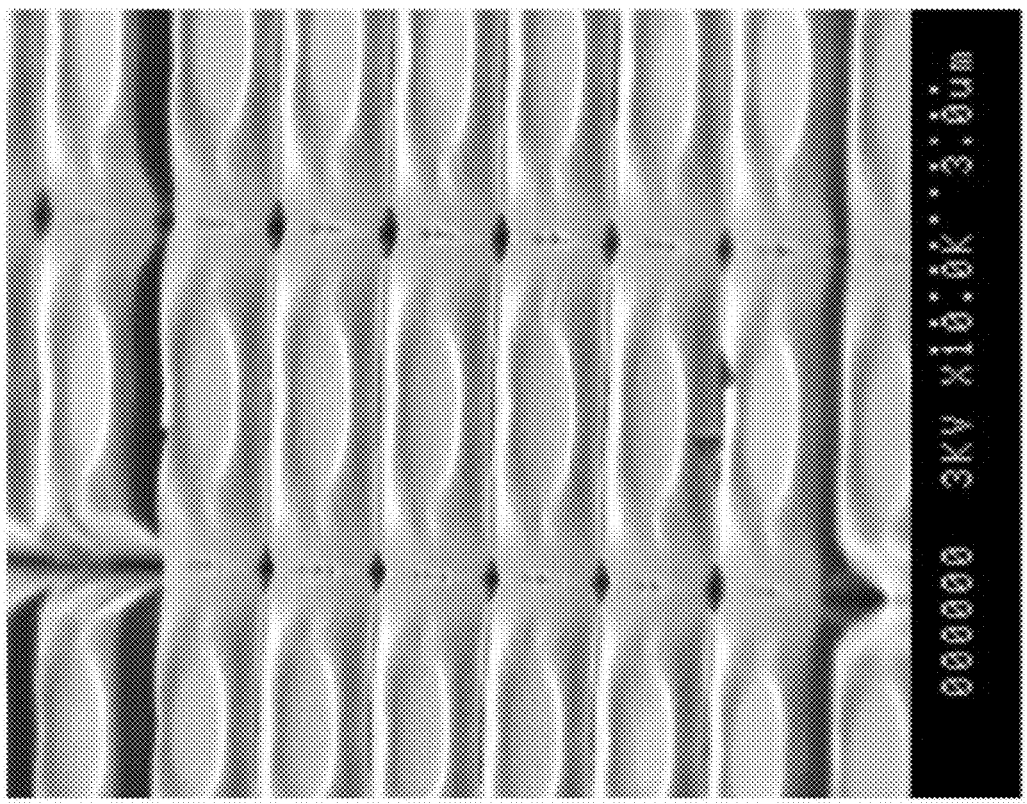
FIG. 15 shows the final etched surface of a pillar structure with etch-matching planarization, which demonstrates excellent surface morphology, with residual surface variations of much less than 1 µm.

After achieving a defect free, planar coating of photoresist, samples are inserted into a ECR plasma etcher. Etching of $^{10}$Boron coated pillar structures has previously been reported. A number of etch conditions have been examined in order to achieve a $^{10}$Boron:S1518 selectivity of close to unity. FIG. 14 shows measured etch rates for $^{10}$Boron and S1518 under the most promising etch conditions, which are 850 W ECR power, 3 mTorr pressure, and 5 sccm $SF_6$. Etches were performed for 150 seconds. Due to the differing temperature dependences of the $^{10}$Boron and S1518 etches, it is not possible to perfectly match the rates. Keeping etch times short enough to prevent significant heating during the etch process is adequate to achieve a sufficiently smooth surface. Etching for longer times may result in alternate results due to increased differential etch rates due to heating during the etch. In addition, uniform thermal contact between the sample and the plate is necessary in order to prevent more rapid etching of localized areas that are not in good contact. The $^{10}$Boron etch rate is ~0.55 μm/min at 500 W. The etch rate for the S1518 is lower than that of $^{10}$Boron at low powers, but increases to 99% of that of $^{10}$Boron at 500 W. This condition was chosen for the initial etch step. Following the initial etch step to planarize the surface, $O_2$ is added to the plasma and etching is performed under the following conditions: 10 sccm $SF_6$, 20 sccm $O_2$, 3 mTorr, 200 W RF, 850 W ECR. FIG. 15 shows the final etch surface of the pillar with etch matching planarization. Note the much smoother morphology of the improved etch using the etch-matching technique. Alternately lapping could be used.

Following the photoresist etch back, metal was deposited by a blanket, conformal coating. Because some amount of topography still exists, use of a wedge, planetary metal deposition system, or high pressure sputtering is preferred in order to ensure adequate coverage of the exposed sidewalls and thus a conformal coating. Coating with photoresist followed by an RIE plasma etch-back allows for conformal metal coatings of structures, which cannot be coated otherwise using physical deposition techniques. The continuous and conformal metal coating results in nearly all of the underlying p-i-n pillar structured diodes to be electrically active.

Figure 16A:
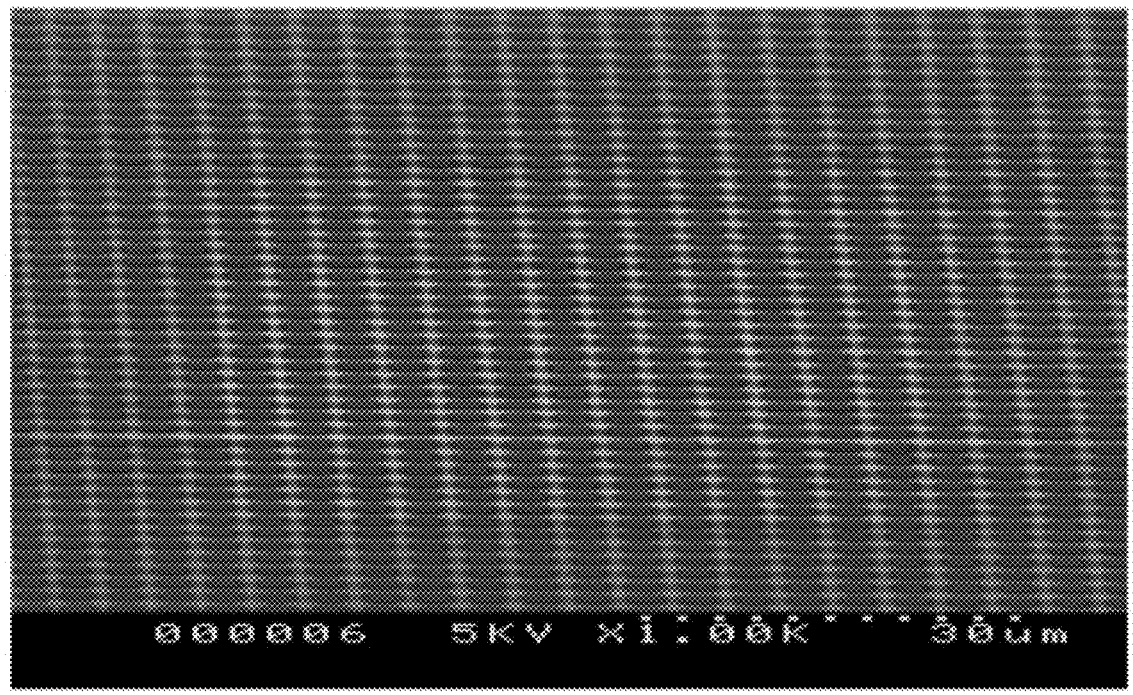
FIGS. 16A-C show SEM pictures with various magnifications of 1 k, 5 k, and 12 k, respectively, of a CMP planarized pillar array.
Figure 16B:
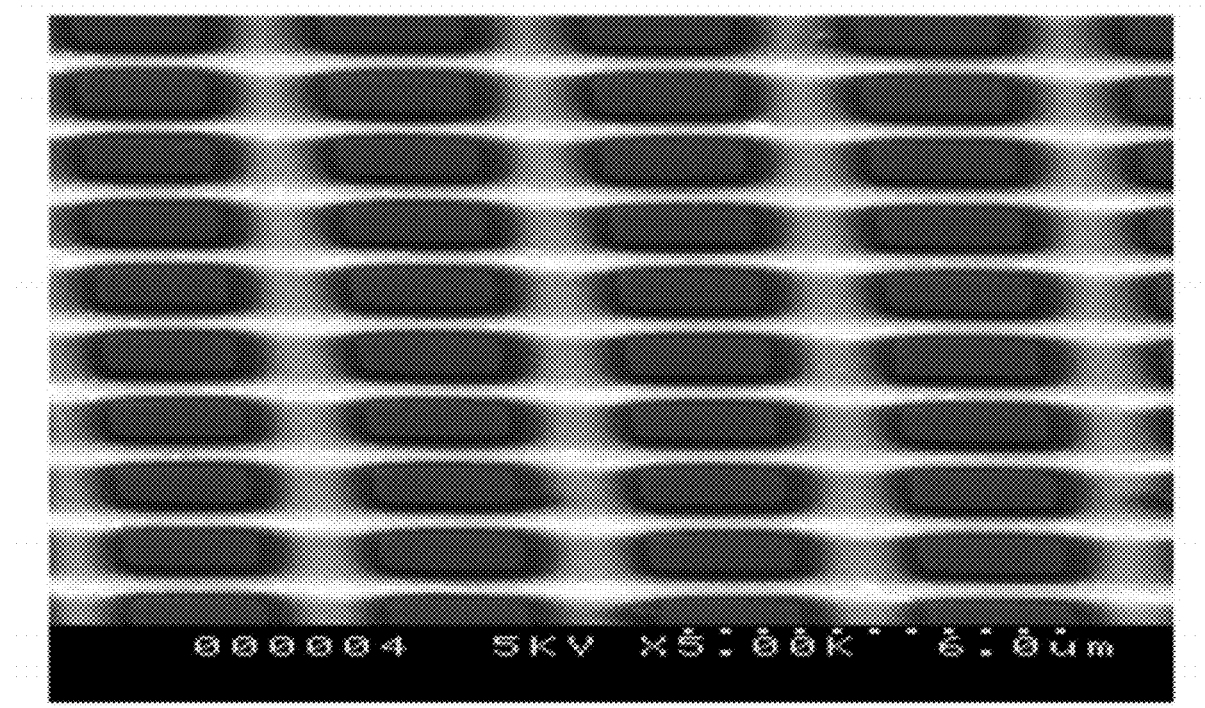
Figure 16C:
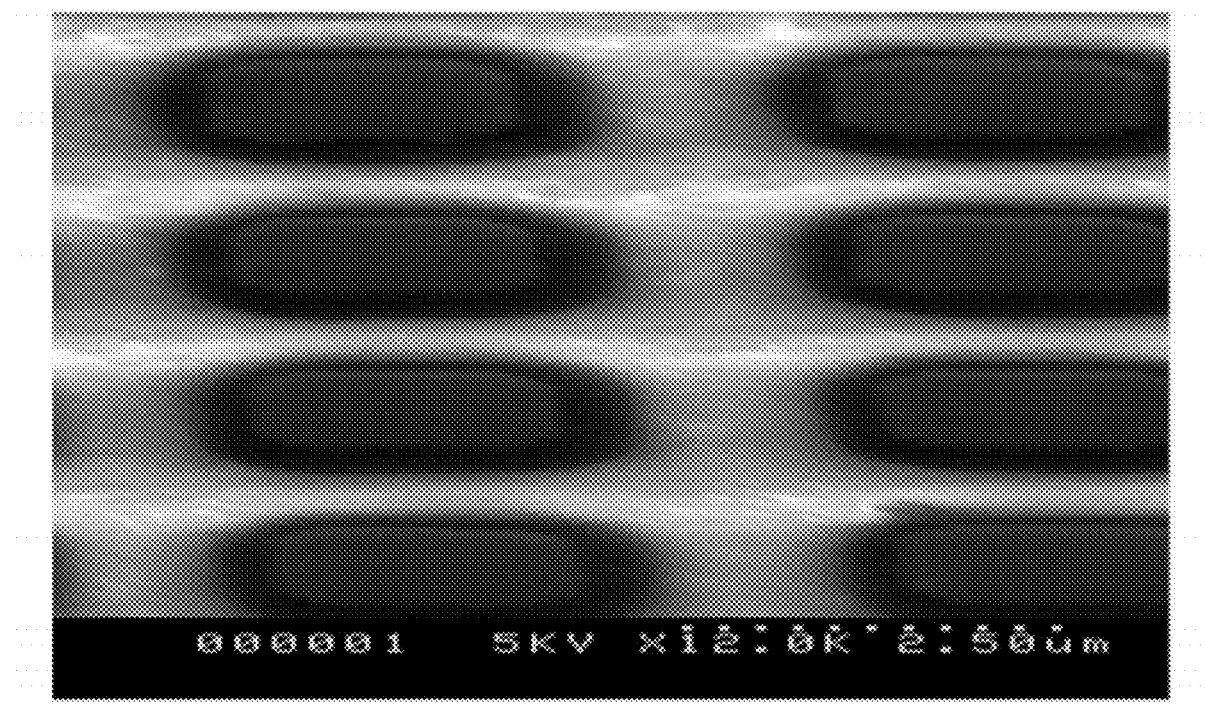

In an exemplary method for planarization by Chemical Mechanical Polishing of a polymer, first the pillar array is fabricated. Then the spin-on-polymer (Honeywell ACCU-FLO2027) is spun on the pillar array. The polymer molecules are cross-linked after baking at 200° C. The process of polymer spin and bake are repeated until the pillar array is totally covered by polymer. The sample is then mounted on glass puck for Chemical Mechanical Polishing (CMP). The slurry used is Alumina (0.05 μm): Electronic surfactant (3M Novec 4200): $H_2O$, 0.1:0.5:100 (vol.). The addition of a small amount of surfactant (0.5%) is used to increase the polymer removal rate and increase the lapping selectivity of polymer/Si pillars. The very small size (0.05 μm) and low concentration (0.1%) abrasive is used to reduce the scratching of the polymer and silicon surfaces during CMP. The plate rotation speed used is 30-70 rpm. The sample can be held by hands or by holding fixture with adjustable pressure. FIGS. 16A-C show SEM pictures with various magnifications of 1 k, 5 k, and 12 k, respectively, of a CMP planarized pillar array.

The foregoing description of the invention has been presented for purposes of illustration and description and is not intended to be exhaustive or to limit the invention to the precise form disclosed. Many modifications and variations are possible in light of the above teaching.

As an example, a 3-D structure that has been fabricated and evaluated using the embodiments of this invention is a pillar-structured thermal neutron detectors. In this structure, the substrate material is comprised of an array of silicon pillars, and the functional fill material is boron. Etch stops have also been developed using both $SiO_2$ and aluminum, however other dielectrics and metals could be used. Etch parameters and compositions have been developed in order to enable all three processes, and are as follows.

In order to etch the boron material we have employed a high-density plasma system with a fluorine containing gas. In addition to this system, we have used ECR (electron cyclotron resonance) planarization etching techniques. We expect that other plasma systems can be employed for this processing approach including ICP (inductively coupled plasma), CCP (capacitively coupled plasma), barrel etcher, planar or cylindrical diode systems, triode systems, and, in general, most other power sources capable of generating a plasma. Removal could also be accomplished using ion beam milling, dry vapor etching with $XeF_2$, nitric acid, ion-assisted chemical etching, or downstream plasma etching. Etching of boron can be accomplished using a fluorine containing plasma such as $F_2$, $NF_3$, $CF_4$, $SF_6$, $XeF_2$, $CHF_3$, $C_2F_6$, or any other gas containing Fluorine. The $SF_6$ plasma yields higher rates compared to $CF_4$, $Cl_2$, and $H_2$ plasmas. In addition, the use of $O_2$ and $H_2$ in the $SF_6$ plasma enables tailoring of the boron:silicon etch-rate ratio, or selectivity. Finally, the use of an etch-stop layer such as aluminum or $SiO_2$ enables etch conditions that would normally cause failure of devices by etching silicon in this case.

The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method, comprising:
    forming a 3-dimentional (3-D) structure comprising a first layer and an array of pillars with cavity regions between said pillars, wherein each pillar of said pillars comprises a first end and a second end, wherein said first end is in contact with said first layer, wherein said first layer comprises only one of n material or p material, wherein each said pillar comprises an intrinsic material;
    forming a segment on said second end of each said pillar, wherein said segment comprises said p material if said first layer comprises said n material and wherein said segment comprises said n material if said first layer comprises said p material;
    filling said cavity regions with a fill material, wherein said fill material covers each said segment;
    removing a first portion of said fill material to produce an exposed portion of said segment;
    simultaneously depositing an electrode onto said fill material and each said exposed segment, thereby forming a conductive layer that provides a common contact to each said exposed segment; and
    depositing a second electrode on said first layer.

2. The method of claim 1, wherein said fill material comprises a support material for supporting said pillars.

3. The method of claim 2, further comprising spin coating said support material into said cavity regions.

4. The method of claim 2, wherein said support material is selected from the group consisting of a photoresist, a polymer and a dielectric.

5. The method of claim 1, wherein said fill material comprises a functional material.

6. The method of claim 5, wherein the step of filling said cavity regions comprises depositing said functional material into said cavity regions.

7. The method of claim 6, wherein said functional material comprises a neutron sensitive material.

8. The method of claim 7, wherein said neutron sensitive material comprises a length sufficient to absorb neutrons propagating along the long aspect of any said cavity region.

9. The method of claim 6, wherein said neutron sensitive material is selected from the group consisting of lithium fluoride, gadolinium and boron.

10. The method of claim 5, wherein said pillars are separated by less than the range of a mean free path of a charged particle produced within said functional material.

11. The method of claim 5, wherein each cavity region of said cavity regions comprises a diameter that is less than the range of at least one neutron reaction-produced particle produced within said functional material.

12. The method of claim 1, wherein said 3-D structure comprises Si.

13. The method of claim 1, wherein each said pillar comprises an aspect ratio within a range from greater than 5 to less than 500.

14. The method of claim 1, wherein between the step of removing a portion of said fill material and the step of simultaneously depositing an electrode, said method further comprises:
    depositing a sacrificial layer over said fill material and said exposed portion; and
    etching back said sacrificial layer to expose at least part of said exposed portion.

15. The method of claim 1, wherein the step of removing a portion of said fill material to produce an exposed portion of said segment comprises:
    depositing a sacrificial layer over said fill material;
    etching back said sacrificial layer to about said fill material; and
    etching back a portion of said fill material to produce an exposed portion of said segment do this later in claims too.

16. The method of claim 15, wherein said fill material comprises an etch rate that is faster than that of said sacrificial layer.

17. The method of claim 1, wherein the removing a portion of said fill material to produce an exposed portion of said segment comprises:
    depositing a sacrificial layer over said fill material; and
    etching back said sacrificial layer and said fill material to produce an exposed portion of said segment.

18. The method of claim 17, wherein said fill material comprises an etch rate that is substantially the same as that of said sacrificial layer.

19. The method of claim 1, wherein the step of removing a portion of said fill material to produce an exposed portion of said segment comprises etching back a portion of said fill material to produce an exposed portion of said segment.

20. The method of claim 1, wherein the step of removing a portion of said fill material to produce an exposed portion of said segment comprises lapping a portion of said fill material to produce an exposed portion of said segment.

21. A method, comprising:
    forming a 3-dimentional (3-D) structure comprising a first layer and an array of pillars with cavity regions between said pillars, wherein each pillar of said pillars comprises a first end and a second end, wherein said first end is in contact with said first layer, wherein said first layer comprises only one of an n material or a p material, wherein each said pillar comprises an intrinsic material;
    forming a segment on said second end of each said pillar, wherein said segment comprises said p material if said first layer comprises said n material and wherein said segment comprises said n material if said first layer comprises said p material;
    filling said cavity regions with a fill material, wherein said fill material covers each said segment;
    removing a first portion of said fill material to produce an exposed portion of said segment, wherein said first portion is removed by a method selected from the group consisting of etching back said first portion and lapping said first portion;
    depositing a sacrificial layer over said fill material and said exposed portion;
    etching back said sacrificial layer to expose at least part of said exposed portion;
    simultaneously depositing an electrode onto said fill material and at least part of each said exposed segment, thereby forming a conductive layer that provides a common contact to each said exposed segment; and
    depositing a second electrode on said first layer.

22. A method, comprising:
    forming a 3-dimentional (3-D) structure comprising a first layer and an array of pillars with cavity regions between said pillars, wherein each pillar of said pillars comprises a first end and a second end, wherein said first end is in contact with said first layer, wherein said first layer comprises only one of an n material or a p material, wherein each said pillar comprises an intrinsic material;
    forming a segment on said second end of each said pillar, wherein said segment comprises said p material if said first layer comprises said n material and wherein said segment comprises said n material if said first layer comprises said p material;
    filling said cavity regions with a fill material, wherein said fill material covers each said segment;
    depositing a sacrificial layer over said fill material;
    etching back said sacrificial layer to about said fill material;
    etching back a portion of said fill material to produce an exposed portion of said segment;
    removing any remaining sacrificial material in contact with said fill material;
    simultaneously depositing an electrode onto said fill material and each said exposed segment, thereby forming a conductive layer that provides a common contact to each said exposed segment; and
    depositing a second electrode on said first layer.

23. The method of claim 22, wherein said fill material comprises an etch rate that is faster than that of said sacrificial layer.

24. A method, comprising:
    forming a 3-dimentional (3-D) structure comprising a first layer and an array of pillars with cavity regions between said pillars, wherein each pillar of said pillars comprises a first end and a second end, wherein said first end is in contact with said first layer, wherein said first layer comprises only one of an n material or a p material, wherein each said pillar comprises an intrinsic material;

forming a segment on said second end of each said pillar, wherein said segment comprises said p material if said first layer comprises said n material and wherein said segment comprises said n material if said first layer comprises said p material;

filling said cavity regions with a fill material, wherein said fill material covers each said segment;

depositing a sacrificial layer over said fill material;

etching back said sacrificial layer and said fill material to produce an exposed portion of said segment;

simultaneously depositing an electrode onto said fill material and each said exposed segment, thereby forming a conductive layer that provides a common contact to each said exposed segment; and depositing a second electrode on said first layer.

25. The method of claim 24, wherein said fill material comprises an etch rate that is substantially the same as that of said sacrificial layer.

26. An apparatus, comprising:
a 3-dimentional (3-D) structure comprising a first layer and an array of pillars with cavity regions between said pillars, wherein each pillar of said pillars comprises a first end and a second end, wherein said first end is in contact with said first layer, wherein said first layer comprises only one of an n material or a p material, wherein each said pillar comprises an intrinsic material;

a segment on said second end of each said pillar, wherein said segment comprises said p material if said first layer comprises said n material and wherein said segment comprises said n material if said first layer comprises said p material;

fill material located in said cavity regions;

an exposed portion of said segment;

an electrode on said fill material and each said exposed segment, thereby forming a conductive layer that provides a common contact to each said exposed segment; and a second electrode on said first layer.

27. The apparatus of claim 26, wherein said fill material comprises a support material for supporting said pillars.

28. The apparatus of claim 27, wherein said neutron sensitive material comprises a length sufficient to absorb neutrons propagating along the long aspect of any said cavity region.

29. The apparatus of claim 26, wherein said fill material comprises a functional material.

30. The apparatus of claim 29, wherein said functional material comprises a neutron sensitive material.

31. The apparatus of claim 30, wherein said neutron sensitive material is selected from the group consisting of lithium fluoride, gadolinium and boron.

32. The apparatus of claim 26, wherein said 3-D structure comprises Si.

33. The apparatus of claim 26, wherein each said pillar comprises an aspect ratio within a range from greater than 5 to less than 500.

34. The apparatus of claim 26, wherein each said pillar comprises an aspect ratio within a range from about 10:1 to about 100:1.

35. The apparatus of claim 26, wherein each said pillar comprises an aspect ratio of about 25:1.

36. The apparatus of claim 26, wherein said pillars are separated by less than the range of a mean free path of a charged particle produced within said functional material.

37. The apparatus of claim 26, wherein each said pillar comprises a diameter of about 2 microns.

38. The apparatus of claim 26, wherein each cavity region of said cavity regions comprises a diameter of about 2 microns.

39. The apparatus of claim 26, wherein each cavity region of said cavity regions comprises a diameter that is less than the range of at least one neutron reaction-produced particle produced within said functional material.

40. The apparatus of claim 26, further comprising a sacrificial layer in said cavity between said fill material and said first electrode.

* * * * *